US012701944B2

(12) United States Patent
Stumpf et al.

(10) Patent No.: US 12,701,944 B2
(45) Date of Patent: *Aug. 4, 2026

(54) MODULAR-COMPONENT SYSTEM FOR GAS DELIVERY

(71) Applicant: Lam Research Corporation, Fremont, CA (US)

(72) Inventors: John Folden Stumpf, Portland, OR (US); Damien Long, Felton, CA (US); Norman Nakashima, Lake Oswego, OR (US); Karl Frederick Leeser, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 104 days.

This patent is subject to a terminal disclaimer.

(21) Appl. No.: 18/638,589

(22) Filed: Apr. 17, 2024

(65) Prior Publication Data

US 2024/0347349 A1      Oct. 17, 2024

Related U.S. Application Data

(63) Continuation of application No. 17/603,214, filed as application No. PCT/US2020/028158 on Apr. 14, 2020, now Pat. No. 11,996,301.

(Continued)

(51) Int. Cl.
*H10P 72/00* (2026.01)
*F16K 27/00* (2006.01)

(52) U.S. Cl.
CPC ........ *H10P 72/0402* (2026.01); *F16K 27/003* (2013.01)

(58) Field of Classification Search
CPC ........... F16K 27/003; Y10T 137/87885; H01L 21/67017
See application file for complete search history.

(56) References Cited

U.S. PATENT DOCUMENTS 5,836,355 A * 11/1998 Markulec .............. F16K 27/003
137/884
5,860,676 A * 1/1999 Brzezicki ............ F15B 13/0817
285/125.1

(Continued)

FOREIGN PATENT DOCUMENTS

CN       1397755 A       2/2003
CN       1105256 C       4/2003
(Continued)

OTHER PUBLICATIONS

"Korean Application Serial No. 10-2020-7035066, Response filed Dec. 18, 2024 to Notice of Preliminary Rejection mailed Oct. 18, 2024", w English claims, 5 pgs.

(Continued)

*Primary Examiner* — David Colon-Morales
(74) *Attorney, Agent, or Firm* — Schwegman Lundberg & Woessner, P.A.

(57) ABSTRACT

In one embodiment, the disclosed apparatus is at least one gas-primitive substrate for use in a gas-delivery box. Each of the at least one gas-primitive substrates has at least one location on which a gas-delivery component is to be mounted. The at least one location has at least a gas-delivery component inlet port and a gas-delivery component outlet port formed within a body of the gas-primitive substrate. At least one first pair of bore holes comprising a gas-flow path is formed on an upstream side and a downstream side, respectively, of the location of the gas-delivery component. Other apparatuses and systems are disclosed.

20 Claims, 21 Drawing Sheets

Related U.S. Application Data

(60) Provisional application No. 62/834,241, filed on Apr. 15, 2019.

(56) References Cited

U.S. PATENT DOCUMENTS

| | | | | | |
|---|---|---|---|---|---|
| 5,944,048 | A * | 8/1999 | Bump | G01F 15/024 | 137/486 |
| 5,992,463 | A * | 11/1999 | Redemann | H01J 37/3244 | 137/884 |
| 6,068,016 | A * | 5/2000 | Manofsky, Jr. | F15B 13/0896 | 137/271 |
| 6,109,303 | A * | 8/2000 | Itafuji | F16K 27/003 | 137/884 |
| 6,142,164 | A * | 11/2000 | Wier | B08B 15/00 | 137/15.04 |
| 6,186,177 | B1 * | 2/2001 | Maher | F17D 1/04 | 137/884 |
| 6,283,155 | B1 * | 9/2001 | Vu | F16K 27/003 | 137/884 |
| 6,293,310 | B1 * | 9/2001 | Redemann | H01J 37/3244 | 137/884 |
| 6,302,141 | B1 * | 10/2001 | Markulec | F16K 27/003 | 137/271 |
| 6,349,744 | B1 * | 2/2002 | Grosshart | C23C 16/44 | 137/884 |
| 6,382,238 | B2 * | 5/2002 | Ishii | F16K 27/003 | 137/271 |
| 6,394,138 | B1 * | 5/2002 | Vu | C23C 16/45561 | 137/884 |
| 6,510,351 | B1 | 1/2003 | Blevins et al. | | |
| 6,539,968 | B1 * | 4/2003 | White | G05D 7/0635 | 138/44 |
| 6,546,961 | B2 * | 4/2003 | Fukushima | F16K 27/003 | 137/884 |
| 6,868,867 | B2 * | 3/2005 | Yamaji | F16K 27/003 | 137/884 |
| 6,952,618 | B2 | 10/2005 | Davlin et al. | | |
| 7,004,199 | B1 * | 2/2006 | Funes | F17D 1/04 | 137/884 |
| 7,017,609 | B2 * | 3/2006 | Miwa | F16K 27/003 | 137/884 |
| 7,036,528 | B2 * | 5/2006 | Eidsmore | F16K 27/003 | 137/884 |
| 7,048,008 | B2 * | 5/2006 | Milburn | F16K 27/003 | 137/884 |
| 7,225,835 | B2 * | 6/2007 | Vu | F16K 27/003 | 137/884 |
| 7,299,825 | B2 * | 11/2007 | Milburn | F17D 1/04 | 137/884 |
| 7,320,339 | B2 * | 1/2008 | Milburn | F17D 1/04 | 137/884 |
| 7,343,926 | B2 * | 3/2008 | Okabe | F16K 31/06 | 137/884 |
| 7,370,674 | B2 * | 5/2008 | Doyle | F16K 27/003 | 285/305 |
| 7,458,397 | B2 * | 12/2008 | Doyle | F17D 1/04 | 137/884 |
| 7,575,616 | B2 * | 8/2009 | DiPrizio | B01D 46/0013 | 55/482 |
| 7,784,496 | B2 * | 8/2010 | Taskar | F16K 27/003 | 251/114 |
| 7,806,143 | B2 * | 10/2010 | Taskar | F16K 27/003 | 137/884 |
| 8,196,609 | B2 * | 6/2012 | Oya | F16K 27/003 | 137/884 |
| 8,307,854 | B1 * | 11/2012 | Vu | F16K 27/003 | 137/884 |
| 8,322,380 | B2 * | 12/2012 | Taskar | F16L 41/03 | 137/884 |
| 8,496,029 | B2 * | 7/2013 | Vu | F16L 41/03 | 137/271 |
| 8,573,247 | B2 * | 11/2013 | Ushigusa | G05D 7/0647 | 138/44 |
| 8,746,057 | B2 * | 6/2014 | Yasuda | G01F 1/50 | 73/204.21 |
| 8,794,267 | B2 * | 8/2014 | Shareef | H01L 21/67253 | 137/884 |
| 8,950,433 | B2 * | 2/2015 | Manofsky, Jr. | F17D 1/00 | 137/884 |
| 9,091,397 | B2 * | 7/2015 | Shareef | F17D 1/00 | |
| 9,169,940 | B2 * | 10/2015 | Yogo | F16K 27/003 | |
| 9,850,920 | B2 * | 12/2017 | Inada | F15B 13/0814 | |
| 10,431,431 | B2 * | 10/2019 | Taskar | C23C 16/52 | |
| 10,557,197 | B2 * | 2/2020 | Lee | C23C 16/45525 | |
| 10,782,710 | B2 * | 9/2020 | Mudd | G05D 7/0682 | |
| 10,830,367 | B2 * | 11/2020 | Aikawa | F17D 3/01 | |
| 10,895,329 | B2 * | 1/2021 | Doya | H01L 21/02 | |
| 11,158,522 | B2 * | 10/2021 | Melcer | H01L 21/67017 | |
| 11,493,162 | B2 * | 11/2022 | Shibata | F17D 1/04 | |
| 11,685,997 | B2 * | 6/2023 | Rezaei | F16L 41/02 | 137/343 |
| 11,853,026 | B2 | 12/2023 | Tu et al. | | |
| 11,996,301 | B2 * | 5/2024 | Stumpf | H01L 21/67017 | |
| 2004/0015336 | A1 | 1/2004 | Kulesz et al. | | |
| 2004/0039456 | A1 | 2/2004 | Davlin et al. | | |
| 2005/0284529 | A1 * | 12/2005 | Iwabuchi | F16K 27/003 | 137/884 |
| 2006/0060253 | A1 * | 3/2006 | Yoshida | F16K 31/0655 | 137/884 |
| 2006/0124179 | A1 * | 6/2006 | Fukagawa | F16K 27/003 | 137/597 |
| 2006/0187017 | A1 | 8/2006 | Kulesz et al. | | |
| 2007/0055388 | A1 | 3/2007 | Araki et al. | | |
| 2007/0203586 | A1 | 8/2007 | Sakurai | | |
| 2008/0078189 | A1 | 4/2008 | Ando | | |
| 2008/0177397 | A1 | 7/2008 | Davlin et al. | | |
| 2008/0302433 | A1 | 12/2008 | Taskar | | |
| 2008/0302434 | A1 | 12/2008 | Taskar | | |
| 2009/0095354 | A1 | 4/2009 | Taskar | | |
| 2009/0171472 | A1 | 7/2009 | Teranisi et al. | | |
| 2010/0096031 | A1 * | 4/2010 | Okase | F16K 27/003 | 251/366 |
| 2011/0127853 | A1 | 6/2011 | Fujita et al. | | |
| 2013/0092704 | A1 | 4/2013 | Tincher et al. | | |
| 2013/0307558 | A1 | 11/2013 | Klapper | | |
| 2014/0110940 | A1 | 4/2014 | Ridgway et al. | | |
| 2014/0324233 | A1 | 10/2014 | Takakura et al. | | |
| 2015/0075660 | A1 | 3/2015 | Inada et al. | | |
| 2016/0092388 | A1 | 3/2016 | Sorenson et al. | | |
| 2017/0075336 | A1 | 3/2017 | Ueda | | |
| 2017/0277607 | A1 | 9/2017 | Samil et al. | | |
| 2018/0011466 | A1 | 1/2018 | Murayama | | |
| 2019/0072989 | A1 | 3/2019 | Nagai et al. | | |
| 2020/0240565 | A1 * | 7/2020 | Rezaei | F16L 41/03 | |
| 2020/0284367 | A1 * | 9/2020 | Kudo | F16K 27/003 | |
| 2021/0125842 | A1 * | 4/2021 | Iwasawa | F16K 27/003 | |
| 2021/0232115 | A1 | 7/2021 | Tu et al. | | |
| 2022/0199431 | A1 | 6/2022 | Stumpf et al. | | |

FOREIGN PATENT DOCUMENTS

| | | | | |
|---|---|---|---|---|
| CN | 1910091 | | 2/2007 | |
| CN | 101325150 | | 12/2008 | |
| CN | 101393430 | A | 3/2009 | |
| CN | 101471555 | A | 7/2009 | |
| CN | 101866853 | | 7/2012 | |
| CN | 103323693 | A | 9/2013 | |
| CN | 104704283 | | 6/2015 | |
| CN | 105977185 | | 9/2016 | |
| CN | 107229221 | A | 10/2017 | |
| CN | 107407922 | A | 11/2017 | |
| CN | 112368653 | A | 2/2021 | |
| CN | 113994460 | A | 1/2022 | |
| CN | 112368653 | | 8/2024 | |
| CN | 119200379 | | 12/2024 | |
| CN | 113994460 | | 5/2025 | |
| CN | 120473408 | | 8/2025 | |
| EP | 0846995 | A2 * | 6/1998 | G05D 7/0635 |
| JP | S6162101 | | 3/1986 | |

(56) References Cited

FOREIGN PATENT DOCUMENTS

| | | | | | |
|---|---|---|---|---|---|
| JP | 2000293207 | A | 10/2000 | | |
| JP | 2001503840 | A | 3/2001 | | |
| JP | 2001337706 | A | 12/2001 | | |
| JP | 2003084801 | A | 3/2003 | | |
| JP | 2009176275 | A | 8/2009 | | |
| JP | 2013231460 | A | 11/2013 | | |
| JP | 2014084870 | A | 5/2014 | | |
| JP | 2014215830 | A | 11/2014 | | |
| JP | 2021523462 | A | 9/2021 | | |
| JP | 2022529263 | A | 6/2022 | | |
| JP | 7444787 | B2 | 3/2024 | | |
| JP | 2024054388 | A | 4/2024 | | |
| JP | 7553468 | | 9/2024 | | |
| JP | 2024174940 | | 12/2024 | | |
| JP | 7652956 | | 3/2025 | | |
| KR | 102798978 | | 4/2025 | | |
| KR | 102822934 | | 6/2025 | | |
| TW | 200738352 | | 10/2007 | | |
| TW | 200940741 | A | 10/2009 | | |
| TW | 200949123 | | 12/2009 | | |
| TW | 201611157 | | 3/2016 | | |
| TW | I615498 | B | 2/2018 | | |
| TW | I835791 | B | 3/2024 | | |
| TW | I860346 | | 11/2024 | | |
| TW | I899834 | B | 10/2025 | | |
| WO | 8102477 | | 9/1981 | | |
| WO | WO-9825058 | A1 * | 6/1998 | ........... | F16K 27/003 |
| WO | WO-2008075631 | A1 | 6/2008 | | |
| WO | WO-2010038344 | A1 * | 4/2010 | ........... | F16K 27/003 |
| WO | WO-2012151292 | A2 * | 11/2012 | ............... | F17D 1/00 |
| WO | 2017140555 | | 8/2017 | | |
| WO | WO-2018047907 | A1 * | 3/2018 | ........... | F16K 27/003 |
| WO | WO-2019217315 | A1 | 11/2019 | | |
| WO | WO-2020214616 | A1 | 10/2020 | | |

OTHER PUBLICATIONS

"Korean Application Serial No. 10-2020-7035066, Notice of Preliminary Rejection mailed Oct. 18, 2024", W English Translation, 25 pgs.

"Taiwanese Application Serial No. 113104191, Office Action mailed Dec. 2, 2024", w English translation, 37 pgs.

"Taiwanese Application Serial No. 113136932, Office Action mailed Jun. 20, 2025", w English Machine Translation, 40 pgs.

Korean Application Serial No. 10-2021-7037133, Notice of Preliminary Rejection mailed May 28, 2024, w/ English translation, 11 pgs.

"Chinese Application Serial No. 202080043581.0, Response filed Jan. 17, 2025 to Office Action mailed Sep. 19, 2024", w English claims, 9 pgs.

"Taiwanese Application Serial No. 113104191, Response filed Feb. 27, 2025 to Office Action mailed Dec. 2, 2024", w English claims, 5 pgs.

U.S. Appl. No. 17/052,778, Advisory Action mailed Jul. 25, 2022, 3 pgs.

U.S. Appl. No. 17/052,778, Final Office Action mailed Feb. 13, 2023, 70 pgs.

U.S. Appl. No. 17/052,778, Final Office Action mailed May 6, 2022, 55 pgs.

U.S. Appl. No. 17/052,778, Non Final Office Action mailed Aug. 15, 2022, 64 pgs.

U.S. Appl. No. 17/052,778, Non Final Office Action mailed Dec. 29, 2021, 47 pgs.

U.S. Appl. No. 17/052,778, Notice of Allowability mailed Nov. 22, 2023, 2 pgs.

U.S. Appl. No. 17/052,778, Notice of Allowance mailed Aug. 8, 2023, 23 pgs.

U.S. Appl. No. 17/052,778, Pre-Appeal Brief Request filed Apr. 13, 2023, 5 pgs.

U.S. Appl. No. 17/052,778, Response filed Mar. 22, 2022 to Non Final Office Action mailed Dec. 29, 2021, 13 pgs.

U.S. Appl. No. 17/052,778, Response filed Jul. 6, 2022 to Final Office Action mailed May 6, 2022, 16 pgs.

U.S. Appl. No. 17/052,778, Response filed Nov. 15, 2022 to Non Final Office Action mailed Aug. 15, 2022, 20 pgs.

U.S. Appl. No. 17/603,214, Non Final Office Action mailed Sep. 14, 2023, 27 pgs.

U.S. Appl. No. 17/603,214, Notice of Allowance mailed Jan. 18, 2024, 9 pgs.

U.S. Appl. No. 17/603,214, Response filed Dec. 13, 2023 to Non Final Office Action mailed Sep. 14, 2023, 20 pgs.

Chinese Application Serial No. 201980044489.3, Office Action mailed Oct. 16, 2023, W/O English Translation, 12 pgs.

Chinese Application Serial No. 201980044489.3, Response filed Feb. 28, 2024 to Office Action mailed Oct. 16, 2023, only current English claims, 3 pgs.

International Application Serial No. PCT/US2019/030918, International Preliminary Report on Patentability mailed Nov. 19, 2020, 8 pgs.

International Application Serial No. PCT/US2019/030918, International Search Report mailed Aug. 20, 2019, 3 pgs.

International Application Serial No. PCT/US2019/030918, Written Opinion mailed Aug. 20, 2019, 6 pgs.

International Application Serial No. PCT/US2020/028158, International Preliminary Report on Patentability mailed Oct. 28, 2021, 13 pgs.

International Application Serial No. PCT/US2020/028158, International Search Report mailed Jul. 29, 2020, 3 pgs.

International Application Serial No. PCT/US2020/028158, Written Opinion mailed Jul. 29, 2020, 11 pgs.

Japanese Application Serial No. 2020-562728, Notification of Reasons for Refusal mailed Jan. 24, 2023, w/English translation., 10 pgs.

Japanese Application Serial No. 2020-562728, Notification of Reasons for Rejection mailed Aug. 15, 2023, W/English Translation, 10 pgs.

Japanese Application Serial No. 2020-562728, Response filed May 25, 2023 to Notification of Reasons for Refusal mailed Jan. 24, 2023, w/ English claims, 16 pgs.

Japanese Application Serial No. 2020-562728, Response filed Nov. 13, 2023 to Notification of Reasons for Rejection mailed Aug. 15, 2023, w/English claims, 14 pgs.

Japanese Application Serial No. 2021-560971, Notification of Reasons for Refusal mailed Mar. 19, 2024, w/ English translation, 10 pgs.

Taiwanese Application Serial No. 108115700, Office Action mailed Mar. 24, 2023, w/ English claims, 13 pgs.

Taiwanese Application Serial No. 108115700, Response filed Jun. 19, 2023 to Office Action mailed Mar. 24, 2023, w/English claims, 39 pgs.

Taiwanese Application Serial No. 109112670, Office Action mailed Jan. 4, 2024, w/o English Translation, 19 pgs.

Taiwanese Application Serial No. 109112670, Response filed Apr. 2, 2024 to Office Action mailed Jan. 4, 2024, Only English Claims, 12 pgs.

"Korean Application Serial No. 10-2021-7037133, Response filed Jul. 29, 2024 to Notice of Preliminary Rejection mailed May 28, 2024", wEnglish claims, 37 pgs.

"Japanese Application Serial No. 2021-560971, Response filed Jul. 12, 2024 to Notification of Reasons for Refusal mailed Mar. 19, 2024", w English claims, 19 pgs.

"Chinese Application Serial No. 202080043581.0, Office Action mailed Sep. 19, 2024", wEnglish Translation, 15 pgs.

"Japanese Application Serial No. 2024-152794, Voluntary Amendment filed Oct. 3, 2024", w English claims, 18 pgs.

Japanese Application Serial No. 2024-152794, Notification of Reasons for Refusal mailed Sep. 24, 2025, w/ English Translation, 4 pgs.

Taiwanese Application Serial No. 113136932, Response filed Sep. 19, 2025 to Office Action mailed Jun. 20, 2025, 51 pgs.

Korean Application Serial No. 10-2025-7012589, Notification of

(56) References Cited

OTHER PUBLICATIONS

Reasons for Rejection mailed Jan. 19, 2026, W/English Translation,
7 pgs.

* cited by examiner

100

101

103

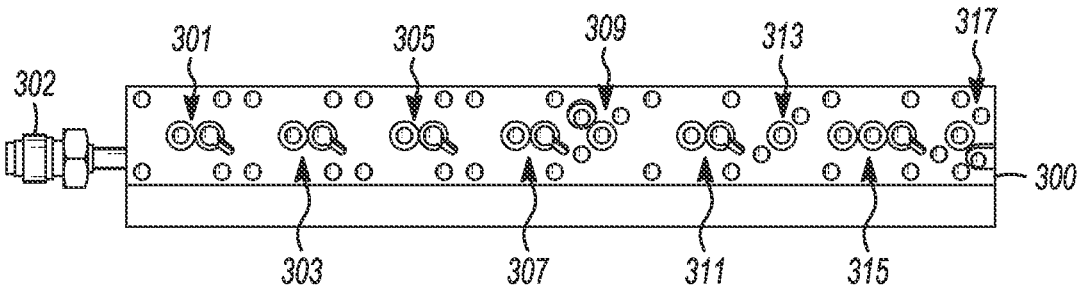
FIG. 3A
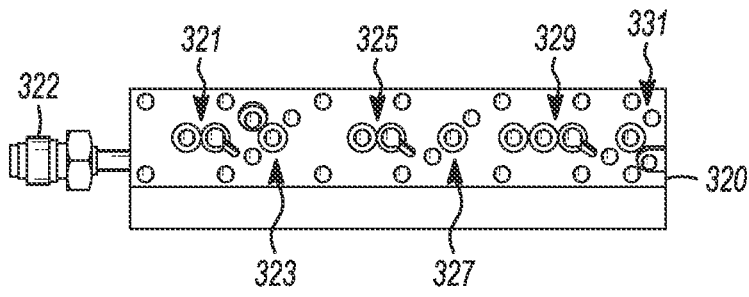
FIG. 3B
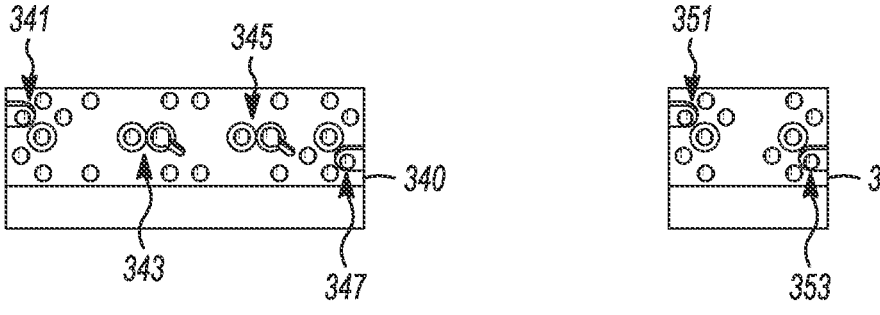
FIG. 3C          FIG. 3D

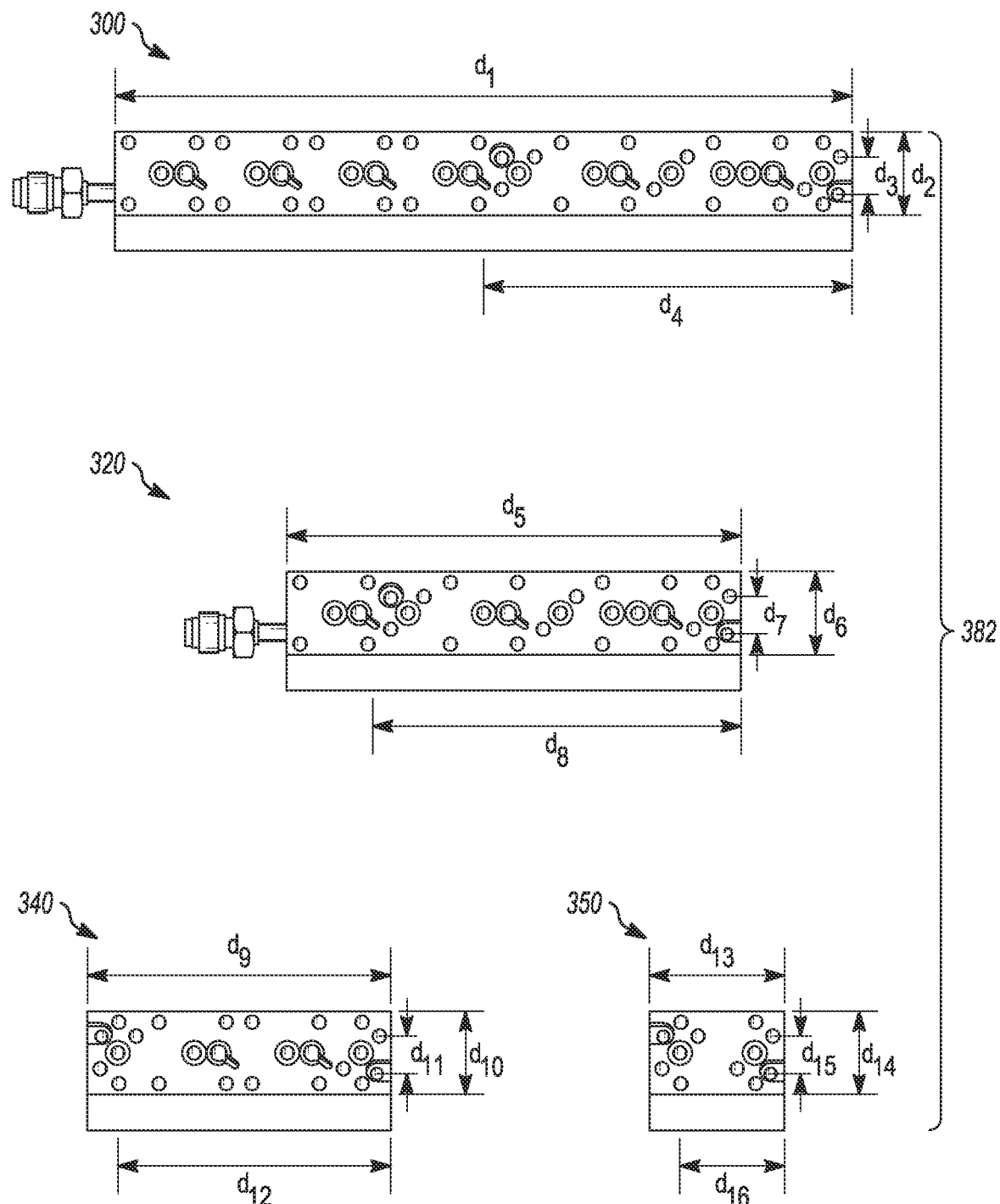
FIG. 3H-A

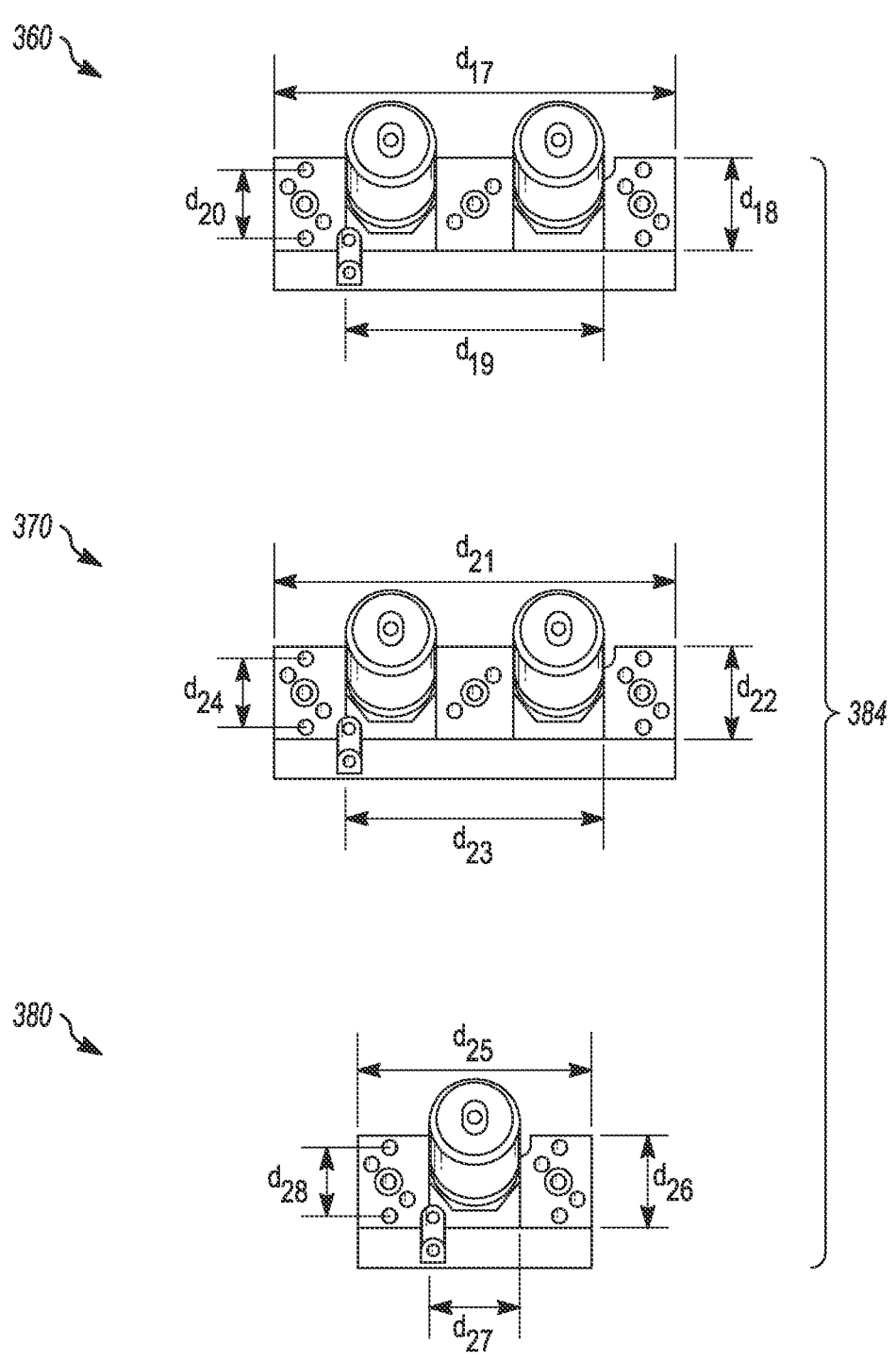
FIG. 3H-B

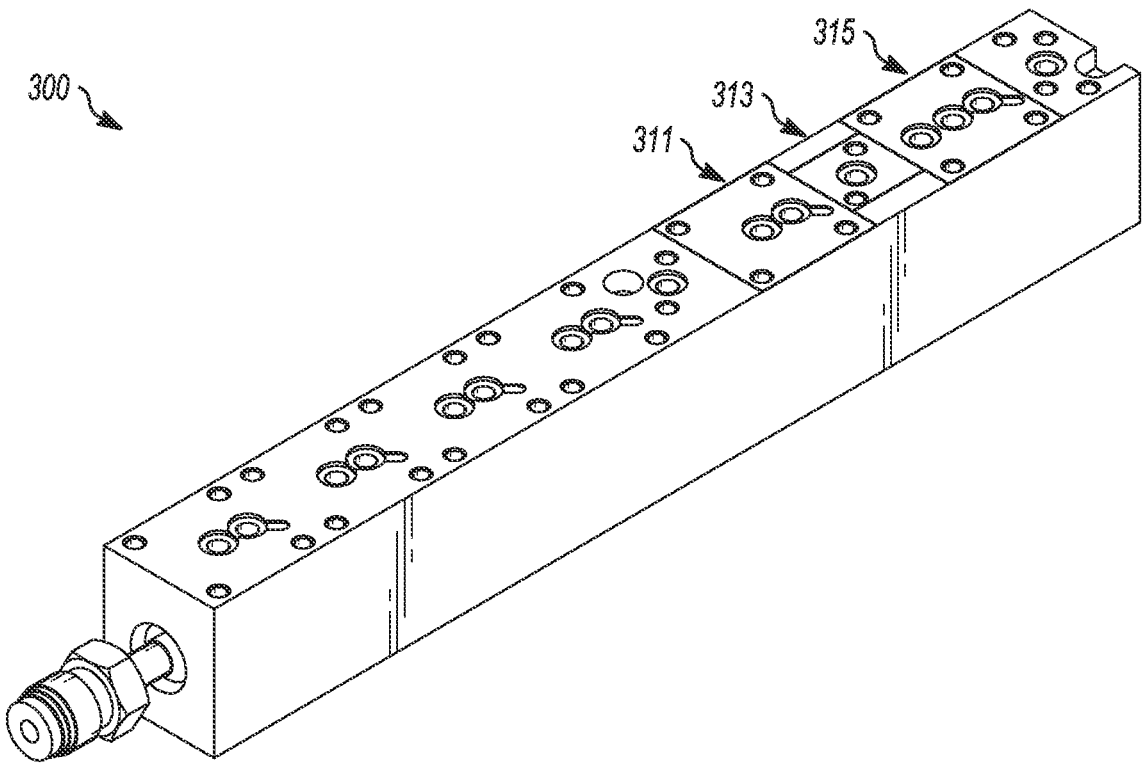
FIG. 3J-A
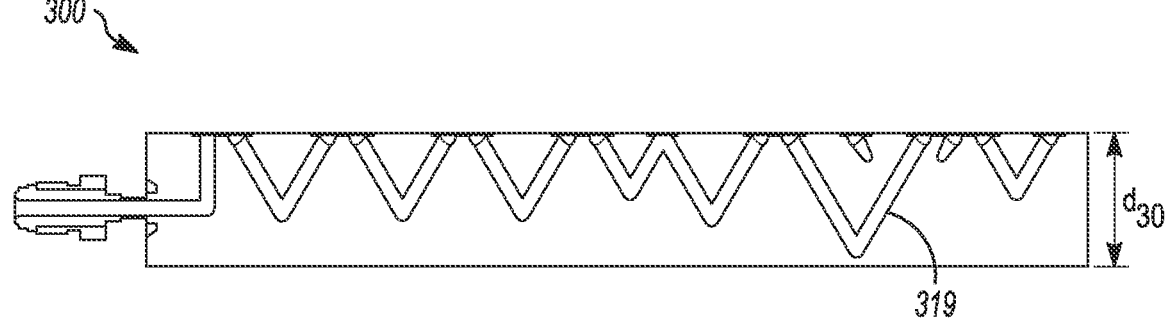
FIG. 3J-B

SECTION A-A

SECTION B-B

SECTION C-C

SECTION D-D

SECTION E-E

SECTION F-F

SECTION G-G

SECTION H-H

1100

1210

MODULAR-COMPONENT SYSTEM FOR GAS DELIVERY

CLAIM OF PRIORITY

This application is a continuation of and claims the benefit of priority under 35 U.S.C. § 120 to U.S. patent application Ser. No. 17/603,214, filed on Oct. 12, 2021, which is a U.S. National Stage Filing under 35 U.S.C. 371 from International Application No. PCT/US2020/028158, filed on Apr. 14, 2020, and published as WO 2020/214616 A1 on Oct. 22, 2020, which claims the priority benefit to U.S. Patent Application Ser. No. 62/834,241, filed on 15 Apr. 2019, and entitled "MODULAR-COMPONENT SYSTEM FOR GAS DELIVERY," each of which is incorporated by reference herein in its entirety.

TECHNICAL FIELD

The subject matter disclosed herein relates to various types of equipment used in the semiconductor and allied industries. More specifically, the disclosed subject matter relates to components used to produce or repair a gas-delivery box for delivering gases used in, for example, semiconductor process equipment as well as other types of equipment using various types of gases.

BACKGROUND

Gas panels or gas boxes are used in semiconductor manufacturing equipment to deliver multiple gases to a vacuum processing chamber to deposit or etch films on substrates. These gas boxes contain multiple gas mass flow controllers (MFCs), one or more for each gas type. An MFC and the associated components to the MFC, such as valves, regulators, filters, and similar types of gas-delivery components, is frequently mounted on and coupled together on a "gas stick." Typically, many gas sticks (e.g., three to thirty or more) are used to provide the necessary gases to the processing chamber of a semiconductor processing tool. Different gases, flows, and pressures may be required for each run on a process tool.

Since end users have diverse needs for process types, gas types and flows, fab operational requirements, sensor data requirements, and so on, gas boxes are typically highly customized for each end user and for each process application. Contemporaneous state-of-the-art high-purity gas flow technology may be an Integrated Gas System (IGS) that uses surface mount gas flow components. The IGS devices use many small, highly modular pieces, to make up a gas stick. Since gas sticks have a limited set of configurations that are repeated from gas stick-to-gas stick, the same configuration of many small, highly modularized pieces may be repeated over-and-over again. Current systems have excessive modularity allowing a vast number of configurations with only a small subset of configurations that are ever used. These systems take a long time to assemble, integrate, and test, and are prone to errors. This means fast configuration of custom gas boxes is not possible. More inventory line items must be tracked and warehoused. In addition, the documentation of any design takes excessive time. In state-of-the-art three-dimensional CAD modeling systems, each part needs to be modeled and then constrained in an assembly of the gas box. Since there are many parts in current IGS systems, a design of a gas box takes an excessive amount of time. The excessive designs and build times mean that the cost of current systems is excessive in the highly customized reality of gas boxes for semiconductor process tools.

Therefore, in various embodiments described herein, the disclosed subject matter describes a limited number of primitive substrates that are used to quickly assemble a variety of gas stick types.

The information described in this section is provided to offer the skilled artisan a context for the following disclosed subject matter and should not be considered as admitted prior art.

SUMMARY

In one exemplary embodiment, the disclosed subject matter describes at least one gas-primitive substrate for use in a gas-delivery box, with each of the at least one gas-primitive substrates including at least one location on which a gas-delivery component is to be mounted, the at least one location comprising at least a gas-delivery component inlet port and a gas-delivery component outlet port formed within a body of the gas-primitive substrate. The exemplary embodiment of the disclosed subject matter also includes at least one first pair of bore holes comprising a gas-flow path formed on an upstream side and a downstream side, respectively, of the location of the gas-delivery component.

In another exemplary embodiment, the disclosed subject matter describes a plurality of gas-primitive substrates for use on a standard back-plane in a gas-delivery box, each of the plurality of gas-primitive substrates including: at least one location on which a gas-delivery component is to be mounted, the at least one location including at least a gas-delivery component inlet port and a gas-delivery component outlet port formed within a body of the gas-primitive substrate, the gas-primitive substrate configured such the gas-delivery component is to be mounted from only an uppermost surface of the gas-primitive substrate; at least one first pair of bore holes comprising a gas-flow path formed on an upstream side and a downstream side, respectively, of the location of the gas-delivery component, the at least one pair of bore holes lays at least partially in a separate cross-sectional plane from a cross-sectional plane of other bore holes in at least some of the plurality of gas-primitive substrate, both cross-sectional planes laying within the body of the gas-primitive substrate; and at least one port selected from ports including a purge port and a gas-splitting port in at least some of the plurality of gas-primitive substrates.

In another exemplary embodiment, the disclosed subject matter describes a gas-primitive substrate, including: a facility inlet having a gas-fitting component; the gas-primitive substrate having a gas-splitting port, a purge port, and an outlet port, each of the gas-splitting port, the purge port, and the outlet port being configured to be coupled to other gas-primitive substrates or to other locations by a top-manifolding interconnection scheme; the gas-primitive substrate being configured to accept gas-delivery components including a two-port lockout/tagout (LOTO) valve, a regulator, a transducer, a filter, an additional two-port valve, and a three-port valve; the gas-primitive substrate further having at least one first pair of bore holes comprising a gas-flow path formed on an upstream side and a downstream side, respectively, of a location of each of the gas-delivery components; and the gas-primitive substrate having a width of about 28.6 mm, an overall height of about 33.8 mm, an overall length of about 239.5 mm, a center-to-center spacing between adjacent gas-delivery components of about 30.5 mm, and being configured to have a pitch distance of about 30.5 mm when arranged with adjacent gas-primitive substrates.

In another exemplary embodiment, the disclosed subject matter describes a gas-primitive substrate, including: a facility inlet having a gas-fitting component; the gas-primitive substrate having a gas-splitting port, a purge port, and an outlet port, each of the gas-splitting port, the purge port, and the outlet port being configured to be coupled to other gas-primitive substrates or to other locations by a top-manifolding interconnection scheme; the gas-primitive substrate is configured to accept gas-delivery components including a two-port lockout/tagout (LOTO) valve, an additional two-port valve, and a three-port valve; and the gas-primitive substrate further having at least one first pair of bore holes comprising a gas-flow path formed on an upstream side and a downstream side, respectively, of a location of each of the gas-delivery components; and the gas-primitive substrate having a width of about 28.6 mm, an overall height of about 33.8 mm, an overall length of about 148.0 mm, a center-to-center spacing between adjacent gas-delivery components of about 30.5 mm, and being configured to have a pitch distance of about 30.5 mm when arranged with adjacent gas-primitive substrates.

In another exemplary embodiment, the disclosed subject matter describes a gas-primitive substrate, including: the gas-primitive substrate having an inlet port and an outlet port, each of the inlet port and the outlet port being configured to be coupled to other gas-primitive substrates or to other locations by a top-manifolding interconnection scheme; the gas-primitive substrate is configured to accept gas-delivery components including a first two-port valve, and a second two-port valve; and the gas-primitive substrate further having at least one first pair of bore holes comprising a gas-flow path formed on an upstream side and a downstream side, respectively, of a location of each of the gas-delivery components; and the gas-primitive substrate having a width of about 28.6 mm, an overall height of about 33.8 mm, an overall length of about 99.5 mm, a center-to-center spacing between adjacent gas-delivery components of about 30.5 mm, and being configured to have a pitch distance of about 30.5 mm when arranged with adjacent gas-primitive substrates.

In another exemplary embodiment, the disclosed subject matter describes a gas-primitive substrate, including: the gas-primitive substrate having an inlet port and an outlet port, each of the inlet port and the outlet port being configured to be coupled to other gas-primitive substrates or to other locations by a top-manifolding interconnection scheme; the gas-primitive substrate is configured to accept a mass-flow controller that can be mounted without a separate outlet valve; and the gas-primitive substrate further having at least one first pair of bore holes comprising a gas-flow path formed between the inlet port and the outlet port; and the gas-primitive substrate having a width of about 28.6 mm, an overall height of about 33.8 mm, an overall length of about 44.5 mm, and being configured to have a pitch distance of about 30.5 mm when arranged with adjacent gas-primitive substrates.

In another exemplary embodiment, the disclosed subject matter describes a gas-primitive substrate, including: the gas-primitive substrate having an inlet port, a purge port, and an outlet port, each of the inlet port, the purge port, and the outlet port being configured to be coupled to other gas-primitive substrates or to other locations by a top-manifolding interconnection scheme; gas-delivery components including a two-port valve and a three-port valve; and the gas-primitive substrate further having at least one first pair of bore holes comprising a gas-flow path formed on an upstream side and a downstream side, respectively, of a location of each of the two-port valve and the three-port valve; and the gas-primitive substrate having a width of about 28.6 mm, an overall height of about 33.8 mm, an overall length of about 118.0 mm, and being configured to have a pitch distance of about 30.5 mm when arranged with adjacent gas-primitive substrates.

In another exemplary embodiment, the disclosed subject matter describes a gas-primitive substrate, including: the gas-primitive substrate having an inlet port, an additional gas port, and an outlet port, each of the inlet port, the additional gas port, and the outlet port being configured to be coupled to other gas-primitive substrates or to other locations by a top-manifolding interconnection scheme; gas-delivery components including a first two-port valve and a second two-port valve, the gas-primitive substrate being configured to mount up to two mass-flow controllers in opposing directions; and the gas-primitive substrate further having at least one first pair of bore holes comprising a gas-flow path formed on an upstream side and a downstream side, respectively, of a location of each of the first two-port valve and the second two-port valve; and the gas-primitive substrate having a width of about 28.6 mm, an overall height of about 33.8 mm, an overall length of about 118.0 mm, and being configured to have a pitch distance of about 30.5 mm when arranged with adjacent gas-primitive substrates.

In another exemplary embodiment, the disclosed subject matter describes a gas-primitive substrate, including: the gas-primitive substrate having an inlet port and an outlet port, each of the inlet port and the outlet port being configured to be coupled to other gas-primitive substrates or to other locations by a top-manifolding interconnection scheme; a gas-delivery component including a two-port valve; and the gas-primitive substrate further having at least one first pair of bore holes comprising a gas-flow path formed on an upstream side and a downstream side, respectively, of a location of each of the two-port valve; and the gas-primitive substrate having a width of about 28.6 mm, an overall height of about 33.8 mm, an overall length of about 118.0 mm, and being configured to have a pitch distance of about 30.5 mm when arranged with adjacent gas-primitive substrates.

BRIEF DESCRIPTION OF THE FIGURES

FIGS. 3A through 3D show exemplary embodiments of various types and sizes of gas-component-configurable primitive-substrates;

FIGS. 3H-A and 3H-B show specific exemplary embodiments of various dimensions of the gas-component-configurable primitive-substrates of FIGS. 3A through 3D and gas-component primitive substrates having integrated valves of FIGS. 3E through 3G;

FIGS. 3J-A and 3J-B show exemplary embodiments for a determination of a height of the primitive substrates of, for example, FIG. 3A;

DETAILED DESCRIPTION

The disclosed subject matter will now be described in detail with reference to a few general and specific embodiments as illustrated in various ones of the accompanying drawings. In the following description, numerous specific details are set forth in order to provide a thorough understanding of the disclosed subject matter. It will be apparent, however, to one skilled in the art, that the disclosed subject matter may be practiced without some or all of these specific details. In other instances, well-known process steps, construction techniques, or structures have not been described in detail so as not to obscure the disclosed subject matter.

One innovation of the disclosed subject matter is a unique minimum set, and reduced or minimum size, of primitive substrates that can be used to form any known gas box or gas panel used with, for example, semiconductor process tools. The current systems have too many degrees-of-freedom (e.g., an excessive modularity) to effectively design and build gas boxes for an integration-to-order (ITO) assembly scenario. As disclosed herein, various embodiments of a gas-system design using seven gas-manifold substrate primitives, which can be configured such that any gas-delivery system for any semiconductor process tool can be built. The seven substrate primitives are produced with dimensions that allow them to be retrofitted into existing gas-delivery boxes and features that make most or all possible component arrangements possible.

Once assembled, the substrate primitives are mounted onto a standard back-plane that is generally universal for any known gas stick configuration. The enclosure, the system interface, and pneumatic banks that drive the process-gas valves are also standardized and universal. Therefore, the design of the gas box needs only a small number of standard components to be placed and constrained in a model to generate a new gas box assembly. This standardization of the hard structure and limited set of primitives to form the gas connections saves significant design time. For the build of the gas box, all the hard structure components, primitive substrates, and gas-flow components can be procured and held in stock. Consequently, the lead time for production of a gas box can be cut from, for example, 8 to 12 weeks down to 1 to 2 weeks.

Figure 1:
FIG. 1 shows a three-dimensional view of an exemplary embodiment of a gas-delivery box using various embodiments of the disclosed subject matter.

With reference now to FIG. 1, a three-dimensional view of an exemplary embodiment of a gas-delivery box 100 using various embodiments of the disclosed subject matter is shown. As is understandable to a skilled artisan, the gas-delivery box 100 is available from a number of sources. The gas-delivery box 100 can be configured to accommodate a number of gas-delivery channels to supply gases to, for example, one or more equipment gas-inlet supply lines of various types of etching and deposition equipment (e.g., plasma-based etching and deposition equipment) as are used in the semiconductor and allied industries. For example, in various embodiments the gas-delivery box 100 can be configured with less than 10 channels, from 10 to 20 channels, or more than 20 channels, where each channel can be coupled to various gas supplies such as various precursor gases. The gas-delivery box 100 includes a back-plane 101 to which various components of the disclosed subject matter can be affixed (e.g., screwed or otherwise physically or chemically attached or adhered) as described in more detail below. The gas-delivery box 100 is shown to include a plurality of gas-component primitives 103 populated with gas-delivery components (e.g., valves, mass-flow controllers, pressure transducers, pressure regulators, etc.). Various ones of the gas-component primitive substrates are described in detail below.

A standard gas-delivery box, such as the gas-delivery box 100, can remain unchanged and can therefore implement directly the gas-component primitive substrates described herein. The back-plane 101, enclosure, printed circuit boards, electrical cables, pneumatic banks, and other components (not all of which are necessarily shown) are each known in the art.

Figures 2A, 2B:
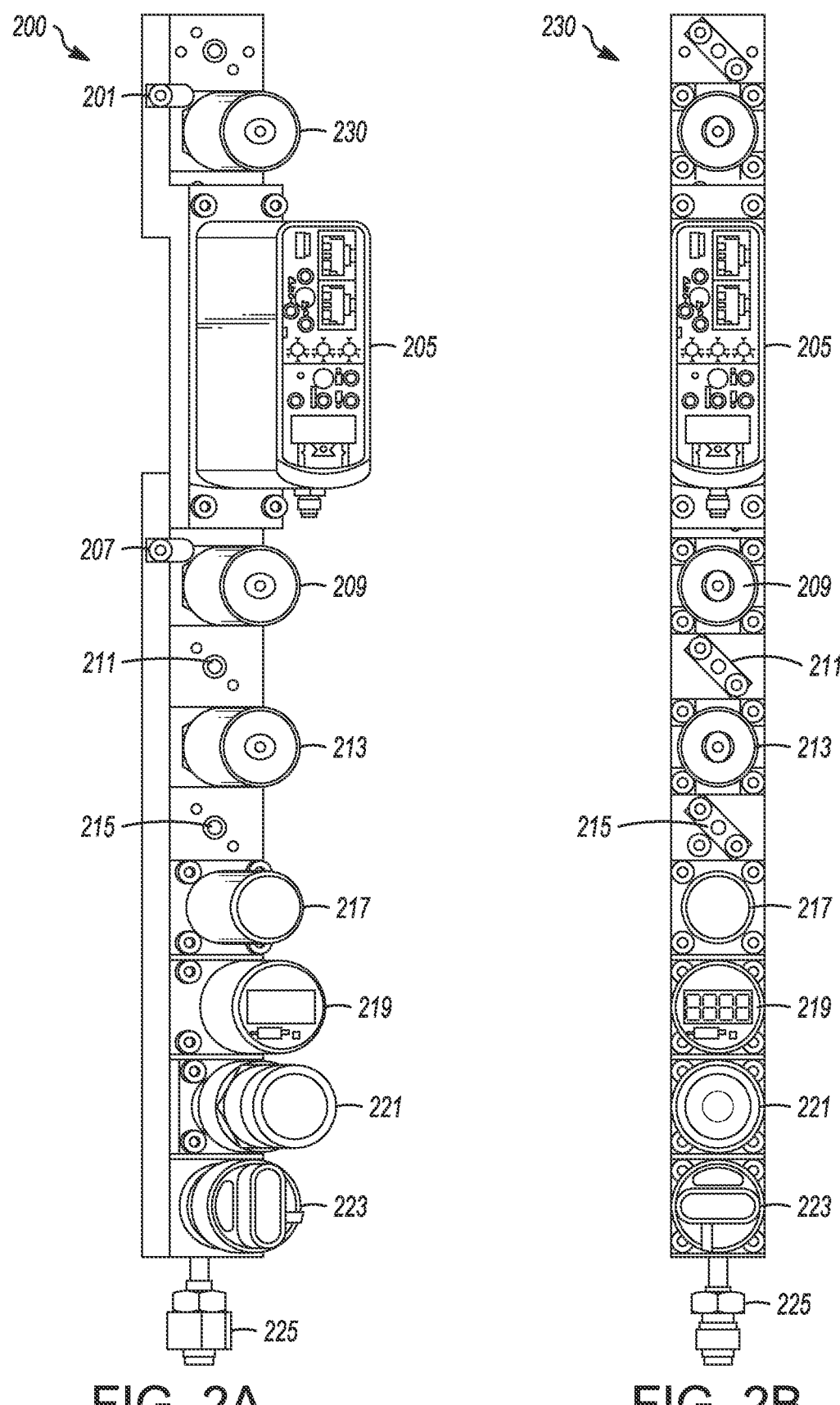
FIG. 2A shows a three-dimensional view of an exemplary embodiment of a number of gas-component primitives, coupled in series, and populated with gas-delivery components in accordance with the disclosed subject matter.
FIG. 2B shows a plan view of an exemplary embodiment of a series of gas-component primitive substrates populated with gas-delivery components in accordance with the disclosed subject matter.

FIG. 2A shows a three-dimensional view 200 of an exemplary embodiment of a number of gas-component primitive substrates, coupled in series, and populated with gas-delivery components in accordance with the disclosed subject matter. As arranged in FIG. 2A, the gas-component primitive substrates and gas-delivery components comprise a gas-delivery channel for use in the gas-delivery box 100 of FIG. 1. Therefore, the three-dimensional view 200 of FIG. 2A is presented merely as an overview of one exemplary embodiment of the disclosed subject matter. Upon reading and understanding the disclosed subject matter, a person of ordinary skill in the art will recognize that portions of the gas-delivery channel may be combined, in whole or in part, with other portions of other gas-delivery channels (e.g., in series, in parallel, or in various series-parallel combinations). The various gas-component primitive substrates of FIG. 2A are described in detail, below.

In this exemplary embodiment, the three-dimensional view 200 is shown to include a two-port-valve primitive substrate 201 and a facility-inlet primitive substrate 207. The two-port-valve primitive substrate 201 is shown to include a two-port valve 203 (e.g., an on-off pneumatic valve). A mass-flow controller 205 bridges from the two-port-valve primitive substrate 201 to the facility-inlet primitive substrate 207. Consequently, the mass-flow controller 205 spans from an outlet port (not shown explicitly in FIG. 2A) of the facility-inlet primitive substrate 207 to an inlet port (also not shown explicitly in FIG. 2A) of the two-port-valve primitive substrate 201. Each of the facility-inlet primitive substrate 207 and the two-port-valve primitive substrate 201 are described in more detail below with reference to FIGS. 4A through 4C and FIGS. 8A and 8B, respectively. The three-dimensional view 200 of FIG. 2A is also shown to include a purge valve 209, a purge port 211, a mass-flow controller inlet valve 213, a gas-splitting port 215, a filter 217, a transducer 219, a regulator 221, a lockout/tagout (LOTO) valve 223, and a gas-fitting component 225.

The purge valve 209 and the purge port 211 allow a purge gas (e.g., nitrogen, oxygen, argon, various types of precursor gases, etc.) to purge the mass-flow controller 205. The gas-splitting port 215 allows an additional gas flow stream either into or out from the facility-inlet primitive substrate 207 (between the filter 217 and the mass-flow controller inlet valve 213). Each of the purge valve 209, the purge port 211, the gas-splitting port 215, and others, may be coupled to other primitive substrates or to other locations by a top-manifolding interconnection scheme, described in detail with regard to FIG. 12, below.

The mass-flow controller inlet valve 213 provides an additional means of isolation (e.g., an additional on-off valve) for the mass-flow controller 205. The filter 217 may comprise a point-of-use-filter to remove most or all particulate contaminants greater than a certain cut-size diameter shed by one or more of the components (e.g., valves, regulator, etc.) upstream of the filter 217. The transducer 219 may comprise a pressure transducer. In various embodiments, the regulator 221 is a pressure regulator that provides a near-constant pressure used for the gas channel.

Upon reading and understanding the disclosed subject matter, a person of ordinary skill in the art will recognize that not all of these components (e.g., valves, MFCs, filters, etc.) may be used or needed in all applications. The person of ordinary skill in the art will further recognize that other applications of the gas-component primitive substrates may include additional ones of the substrates as well as other components mounted or included with or on the primitive substrates.

The LOTO valve 223 is designed for applications where safety of personnel and equipment are a consideration. For example, in the United States, the Occupational Safety and Health Administration (OSHA) maintains industry standards that include an ability to disable machinery or equipment to prevent the release of hazardous materials (e.g., hazardous gases) during equipment maintenance. Similar governmental agencies exist in most countries or regions of the world.

For example, the LOTO valve 223 can be used to prevent a release of one or more gases that may be particularly detrimental to human safety or machine safety and operation during a maintenance procedure (e.g., replacing one or more components from one or more gas-component primitive substrates). In one specific example, a person of ordinary skill in the art knows that silane ($SiH_4$) gas is an inorganic colorless gaseous compound of silicon and hydrogen that has strong reducing properties and is spontaneously flammable in air. Consequently, if mixed, oxygen and silane can potentially explode or ignite. The LOTO valve 223 can prevent such inadvertent release of such gases.

In various embodiments, the gas-fitting component 225 may comprise a tube fitting, which is known in the art (e.g., tube fittings are available from, for example, the Swagelok Company of Solon, Ohio, USA or Parker Hannifin Corporation of Cleveland, Ohio, USA). In other embodiments, the gas-fitting component 225 may be flared into, for example, a VCR® metal-to-metal seal feature, as is known in the art, or welded onto a male VCR® tube stub. In other embodiments, the gas-fitting component 225 may be formed as, for example, a VCO® O-ring face seal fitting (VCR® and VCO® seal fittings are registered trademarks of the Swagelok Company of Solon, Ohio, USA). A person of ordinary skill in the art will recognize that other types of fittings may be used as well.

Referring now to FIG. 2B, a plan view 230 of an exemplary embodiment of a series of gas-component primitive substrates populated with gas-delivery components in accordance with the disclosed subject matter is shown. The plan view 230 provides one embodiment of an order in which various components (e.g., valves, regulators, filters, etc.) may be placed on the various gas-component primitive substrates described herein.

For example, the LOTO valve 223 is typically placed upstream of all other components in order to safeguard personnel and equipment while the gas-delivery box 100 (see FIG. 1) is being serviced or otherwise maintained. The regulator 221 is then placed downstream of the LOTO valve 223. If the regulator 221 is a pressure regulator, the regulator 221 can be set to provide a near-constant pressure of gases used within series-connected gas-component primitive substrates of FIG. 2B (the gas channel). The transducer 219 is located immediately downstream of the regulator 221 to monitor, for example, pressure within the gas channel. The filter 217 is mounted upstream of the gas-splitting port 215 to filter gas flow that is shared with, for example, additional components such as other gas-component primitive substrates (not shown). The mass-flow controller inlet valve 213 (comprising a two-port valve in this embodiment) is located downstream of the gas-splitting port 215 to avoid gas-flow disruption to the other gas-component primitive substrates while still being able to shut off gas flowing to the mass-flow controller 205. The purge valve 209 is downstream of the mass-flow controller inlet valve 213 and upstream of the mass-flow controller 205. The purge valve 209 therefore allows purging of the mass-flow controller 205 to allow purging of the mass-flow controller 205 (e.g., due to the mass-flow controller 205 failing) without needing to shut off the LOTO valve 223 (which would also shut off gas flowing to other components through the gas-splitting port 215).

Upon reading and understanding the disclosed subject matter, a person of ordinary skill in the art will recognize readily that the plan view 230 of an exemplary embodiment of a series of gas-component primitive substrates populated with gas-delivery components of FIG. 2B may be configured with the various gas-flow components in positions other than those shown. Therefore, the placement of the gas-delivery components may be arranged in any order desired that may be deemed suitable for a given application.

FIGS. 3A through 3D show exemplary embodiments of various types and sizes of gas-component-configurable primitive-substrates. As shown in FIG. 3A, an example of a facility-inlet primitive substrate 300 includes a gas-fitting component 302 and is configured at various locations to accept a two-port LOTO valve 301, a regulator 303, a transducer 305, a filter 307, a gas-splitting port 309, an additional two-port valve 311, a purge port 313, a three-port valve 315, and an outlet port 317. Therefore, the facility-inlet primitive substrate 300 may the same as or similar to the facility-inlet primitive substrate 207 of FIGS. 2A and 2B. A skilled artisan will recognize that the various arrangements shown above may also be configured in other ways. For example, locations for the regulator 303, the transducer 305, a filter 307, and the additional two-port valve 311 may all be interchanged depending upon a particular application. Therefore, the locations for various gas-delivery components in FIGS. 3A through 3D are given merely as an aid in understanding various embodiments of the disclosed subject matter.

As shown in FIG. 3B, an example of an additional facility-inlet primitive substrate 320 includes a gas-fitting component 322 and is configured at various locations to accept a two-port LOTO valve 321, a gas-splitting port 323, an additional two-port valve 325, a purge port 327, a three-port valve 329, and an outlet port 331.

As shown in FIG. 3C, an example of a dual two-port-valve primitive substrate 340 (e.g., a two-port/two-port substrate) is shown that includes an inlet port 341, an outlet port 347, and is configured at various locations to accept a first two-port valve 343 and a second two-port valve 345.

FIG. 3D shows an example of a dual single-port primitive substrate 350 (e.g., a one-port/one-port substrate) that includes an inlet port 351 and outlet port 353. The dual single-port primitive substrate 350 may be used, for example, with an MFC that can be mounted without a separate outlet valve due to the outlet port 353 in the substrate.

Figure 3E:
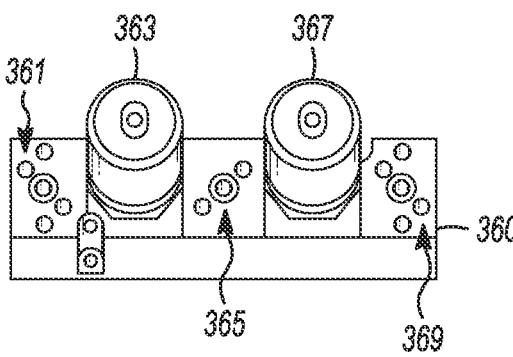
FIGS. 3E through 3G show exemplary embodiments of various types and sizes of gas-component primitive substrates having integrated valves.
Figure 3F:
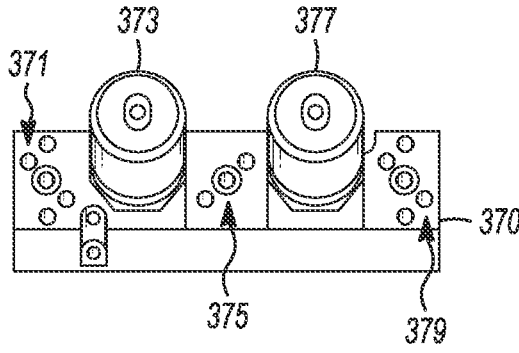
Figure 3G:
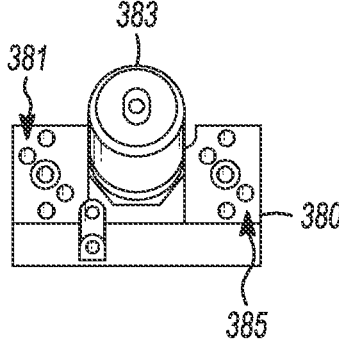

FIGS. 3E through 3G show exemplary embodiments of various types and sizes of gas-component primitive substrates having integrated valves. A person of ordinary skill in the art will recognize that each of the substrates with integrated valves could readily be constructed using various ones of the substrates of FIGS. 3A through 3D. However, having the valves already integrated as part of the substrate speeds production of gas-delivery channels as described above.

For example, FIG. 3E shows an example of a dual-valve substrate 360 (e.g., a two-port/three-port substrate) that includes an inlet port 361, an outlet port 369, a purge port 365, and further includes locations for a two-port valve 363 and a three-port valve 367. The two-port valve 363 allows for a shut-off operation and the three-port valve 367, combined with the purge port 365, allows for a purge operation as will be recognizable to a skilled artisan.

FIG. 3F shows an example of a dual two-port-valve substrate 370 (e.g., a two-port/two-port substrate) that includes an inlet port 371, an outlet port 379, an additional gas port 375, a first two-port valve 373, and a second two-port valve 377. The dual two-port-valve substrate 370 provides for, for example, two mass-flow controllers to be mounted in opposing directions (e.g., conjoined MFCs).

FIG. 3G shows an example of a single two-port-valve substrate 380 (e.g., a two-port substrate) that includes an inlet port 381, an outlet port 385, and a two-port valve 383. The single two-port-valve substrate 380 provides a single shut-off valve. Additionally, the single two-port-valve substrate 380 may be the same as or similar to the two-port-valve primitive substrate 201 of FIGS. 2A and 2B.

Figure 11:
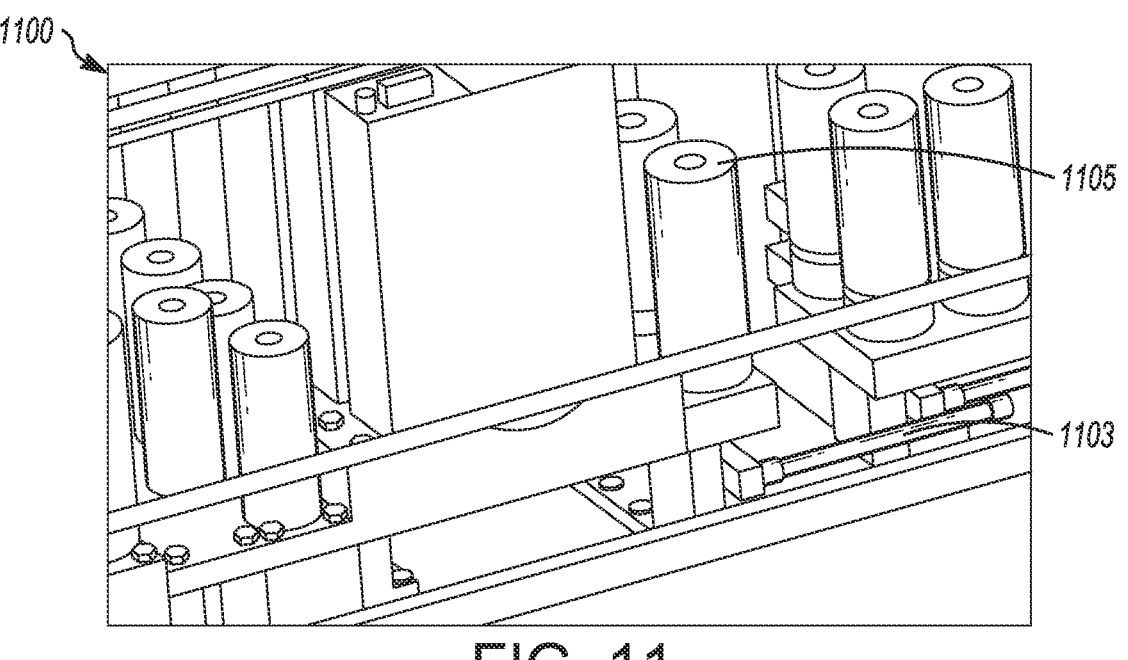
FIG. 11 shows a bottom-outlet manifolding system of the prior art.

Various ones of the ports of the gas-component-configurable primitive-substrates, of FIGS. 3A through 3D, and the gas-component primitive-substrates. of FIGS. 3E through 3G can be coupled to other ports and/or substrates in a top-manifolding system, as described in detail with reference to FIG. 12, below. For example, each of the inlet ports 341, 351, 361, 371, 381 of one substrate can be coupled to or from various one (or ones) of the outlet ports 317, 331, 347, 353, 369, 379, 385 on other substrates. The top-manifolding system allows each of these connections to be made from a top side of the primitive substrate, rather than from underneath (or a lower side) as shown in FIG. 11 of the prior art.

Figure 4A:
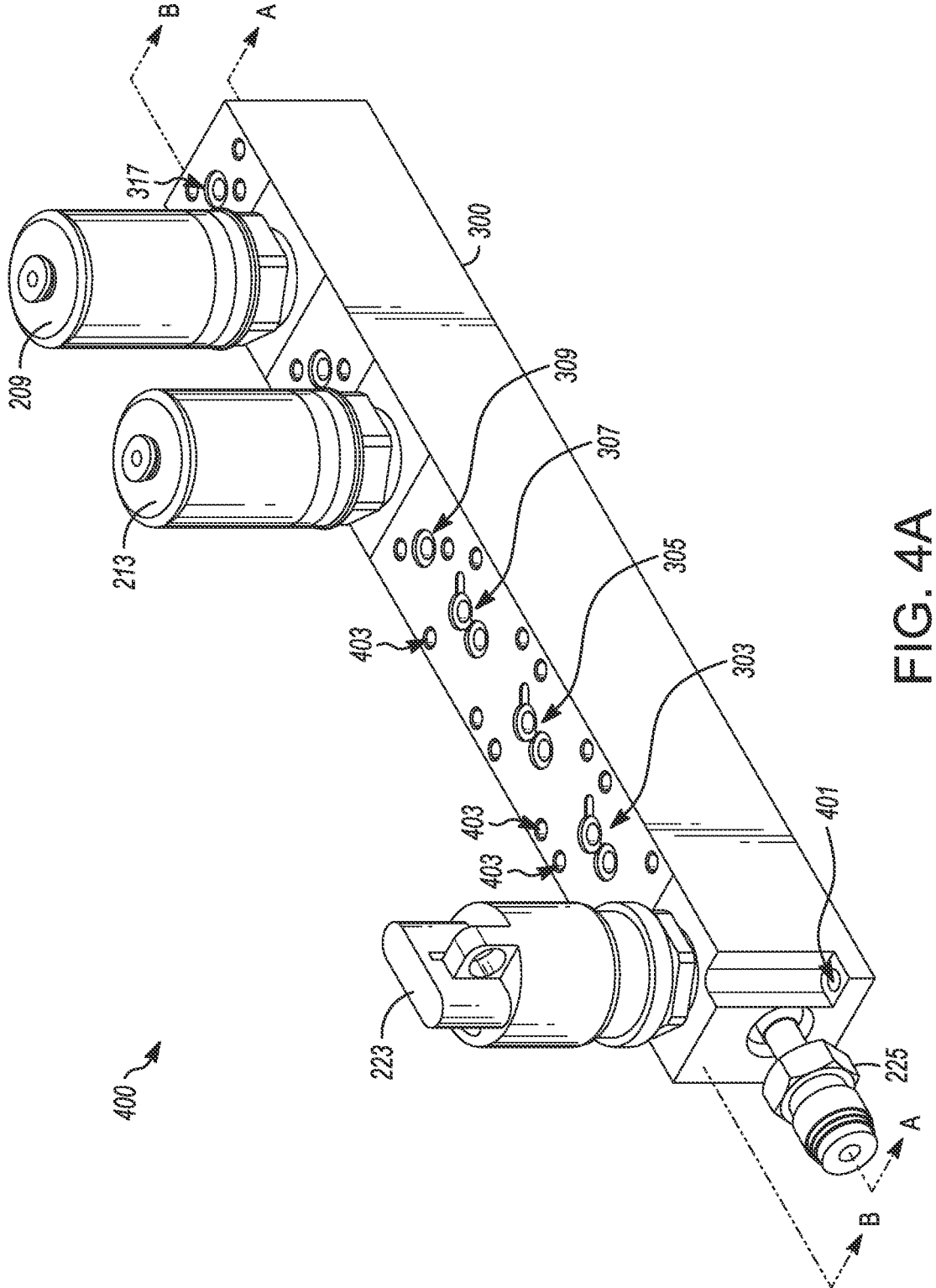
FIGS. 4A through 4C show additional details of the facility-inlet primitive substrate in accordance with FIG. 3A used as, for example, a facility inlet to couple a gas supply to the gas-delivery box of FIG. 1.
Figure 4B:
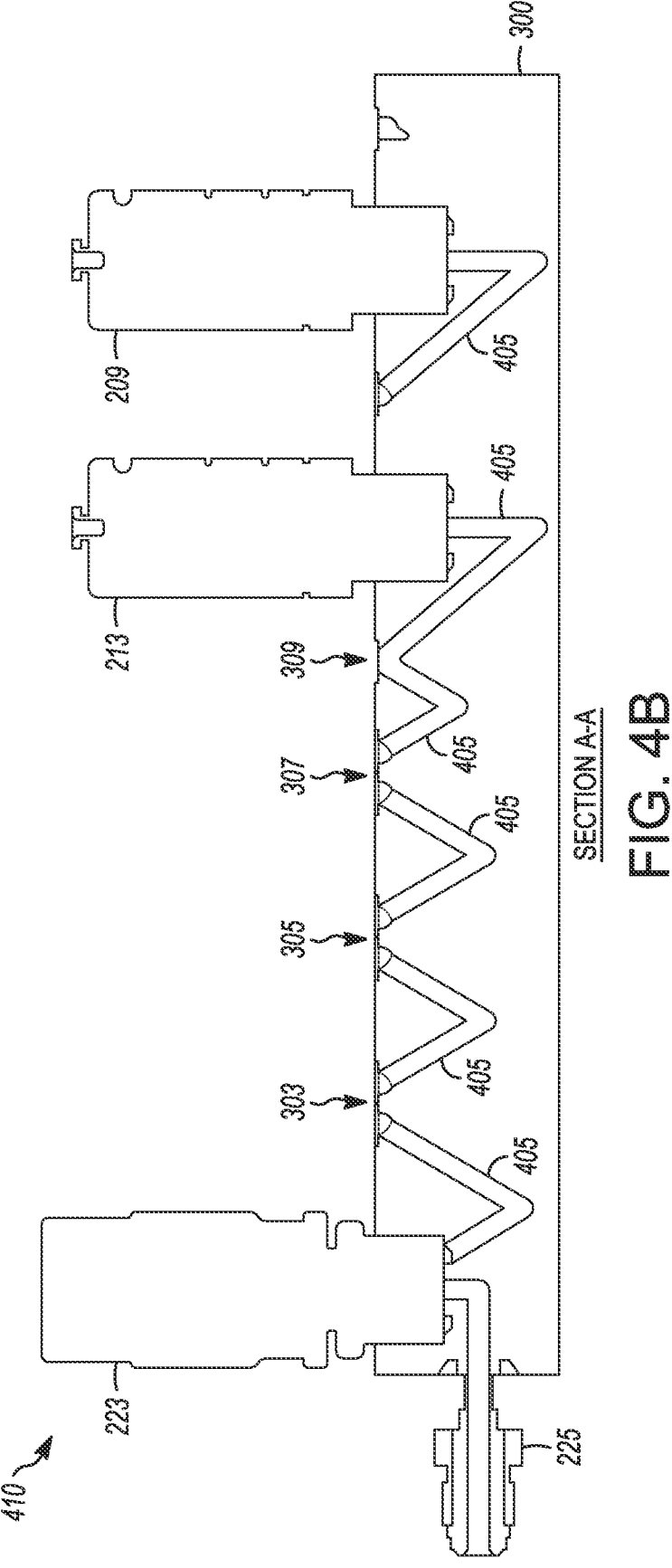
Figure 4C:
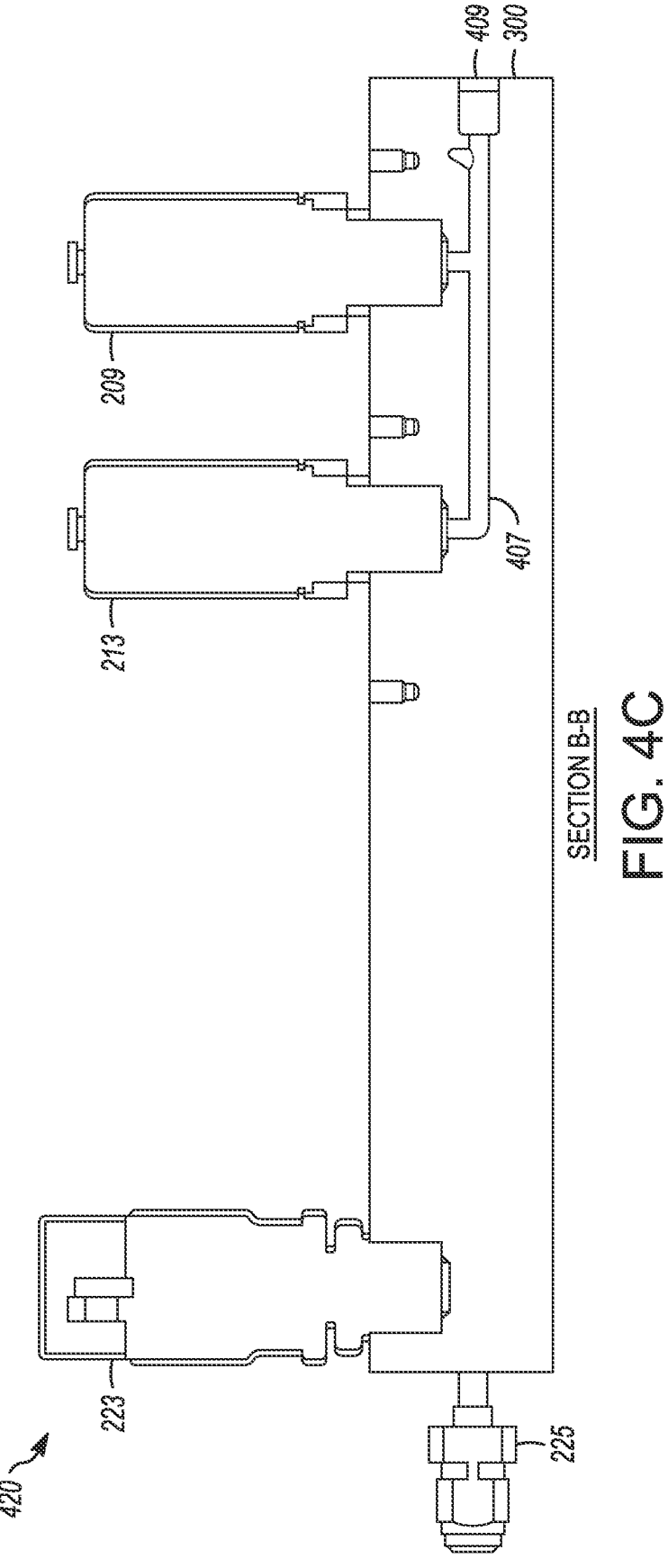

A skilled artisan will now recognize that each of the gas-component primitive facility-inlet substrates of FIGS. 3A and 3B may be combined with various ones of the gas-component primitive substrates of FIGS. 3C through 3G to prepare quickly any number of gas-delivery channels to be mounted in, for example, the gas-delivery box 100 (see FIG. 1). Additionally, the primitive substrates of FIGS. 3A through 3G are also shown in more detail with reference to particular ones of FIGS. 4A through 8B. For example, FIGS. 4A through 4C show additional details of the gas-component-configurable primitive-substrate in accordance with FIG. 3A used as, for example, a facility inlet to the gas-delivery box of FIG. 1. Further, a number of locations (not explicitly identified or numbered but understandable to a skilled artisan) for which various types of fasteners may be used to mount various ones of the gas-delivery components to the various substrates are also shown with reference to particular ones of FIGS. 4A through 8B. For example, in various embodiments, the gas-delivery components may be mounted with metal "C" seals or "W" seals to seal the gas path. The screws used in these fasteners are special low-friction, high-strength screws to crush the metal seals. A person of ordinary skill in the art recognizes these types of fasteners (available from, for example, American Seal and Engineering, Orange, Connecticut, USA and Fujikin® of America, Inc., Fremont, California, USA). In other embodiments, fasteners such as machine screws may be used.

The person of ordinary skill in the art will further recognize that each of the gas-component primitive substrates may be machined or otherwise formed from a variety of materials. For example, for ultra-high purity (UHP) gas systems, standards in the semiconductor industry (e.g., as promulgated by Semiconductor Equipment and Materials International (SEMI), Milpitas, California, USA), include a "specification for 316L stainless steel . . . [for] ultra-high purity semiconductor-manufacturing applications," per SEMI Standard F20, which uses a double melting to improve the purity. A SEMI "specification for the surface condition of the wetted surfaces of stainless steel components," uses electropolished interior surfaces according to SEMI Standard F19, for all gases and liquids. For highly corrosive gases such as, for example, hydrogen chloride (HCl) or hydrogen bromide (HBr), a corrosive material with high corrosive resistance may be used, including a variety of high-performance alloys (also known as superalloys), known in the art. These high-performance alloys include, for example, Inconel® (available from different sources including Inco Alloys International, Inc., Huntington, West Virginia, USA) or Hastelloy® (available from different source including Haynes Stellite Company, Kokomo, Indiana, USA and Union Carbide Corporation, New York, New York, USA). In other examples, such as non-UHP gas systems, the substrates may be formed from, for example, 316L-grade stainless steel that do not necessarily comply with SEMI Standards. Still further, for applications that do not transport caustic or corrosive gases, another material may be used to form the substrates. For example, in these applications, the substrate may be formed from 304-grade stainless steel, 6061 aluminum or other aluminum alloys, copper or zinc alloys (e.g., brass), or various types of machinable and/or formable polymers and high-performance plastics (e.g., Delrin® or Kepital®, both of which are known in the art).

Upon reading and understanding the disclosed subject matter, a person of ordinary skill in the art will further recognize that various types of gas-delivery components described herein may be mounted to various ones of the primitive substrates by, for example, machine screws supplemented with a metal seal (e.g., as discussed above). In these cases, each seal may be checked for a helium leak-rate of about $10^{-9}$ Torr liter per second, maximum. In other examples, depending on the type of gas transported, an O-ring fabricated from Kalrez® or other types of perfluorinated elastomer or fluoroelastomer materials, known in the art, may be used to prevent gas from leaking between the gas-delivery component and the primitive substrate.

Further, upon reading and understanding the disclosed subject matter, a person of ordinary skill in the art will recognize that more or fewer gas-component primitive substrates may be utilized for various applications and that the number may vary for a particular type of gas-delivery box 100 (see FIG. 1) used for various process tools or process tools or equipment used in different industries. For example, a process tool used for fabricating thin-film heads in the data-storage industry may need fewer gas-component primitive substrates (e.g., fewer gas channels) than a process tool used to fabricate films produced by an atomic-layer deposition (ALD) techniques. Also, the person of ordinary skill in the art will recognize that the arrangement for which gas-delivery components of each of the various gas-component primitive substrates may vary depending upon a particular use and application as well. Therefore, each of these various arrangements shall be considered to be within a scope of the appended claims.

Figure 3I:
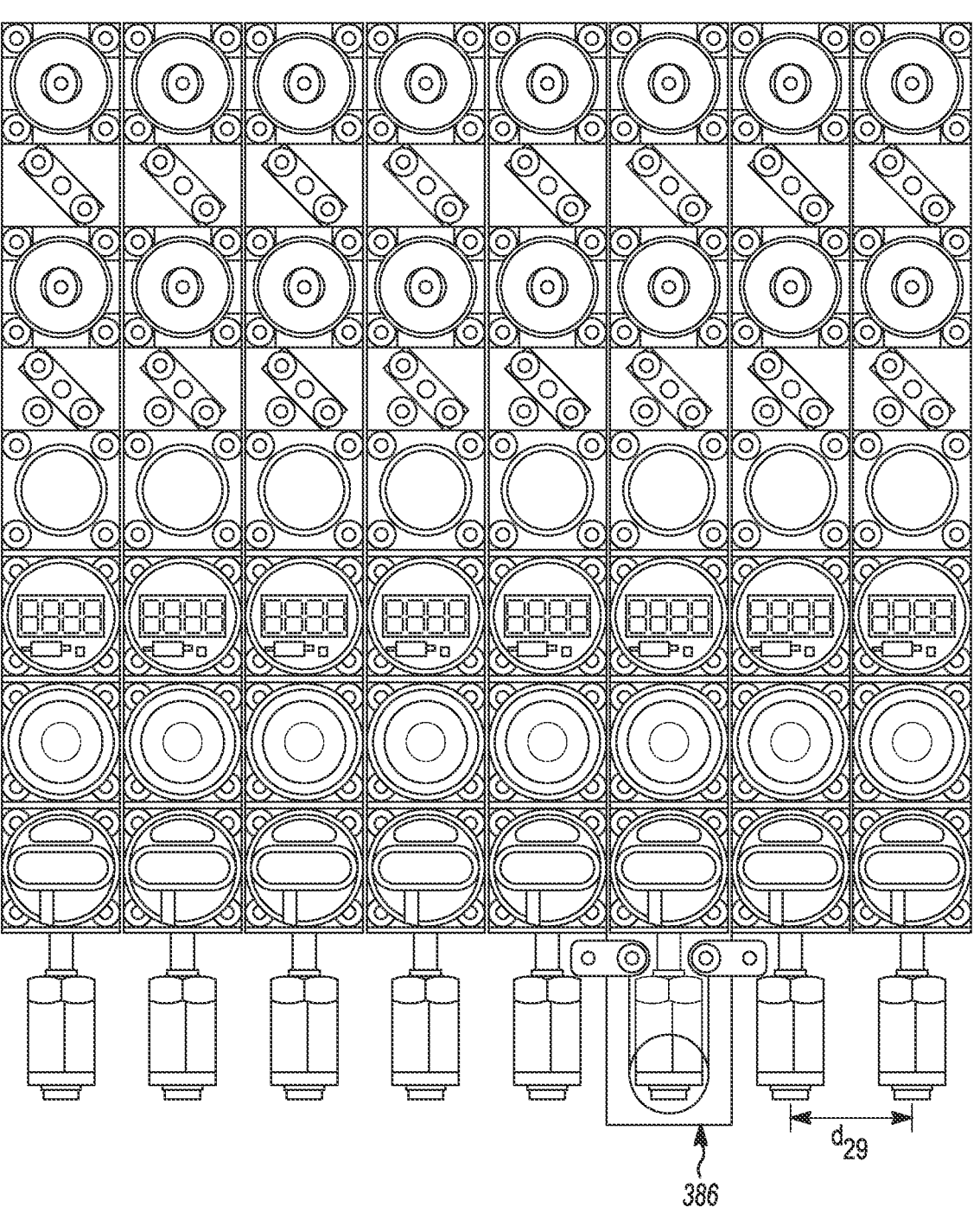
FIG. 3I shows an exemplary embodiment for a determination of a substrate-to-substrate distance (pitch distance) of the primitive substrates of, for example, FIG. 3A.
Figures 3K, 3L:
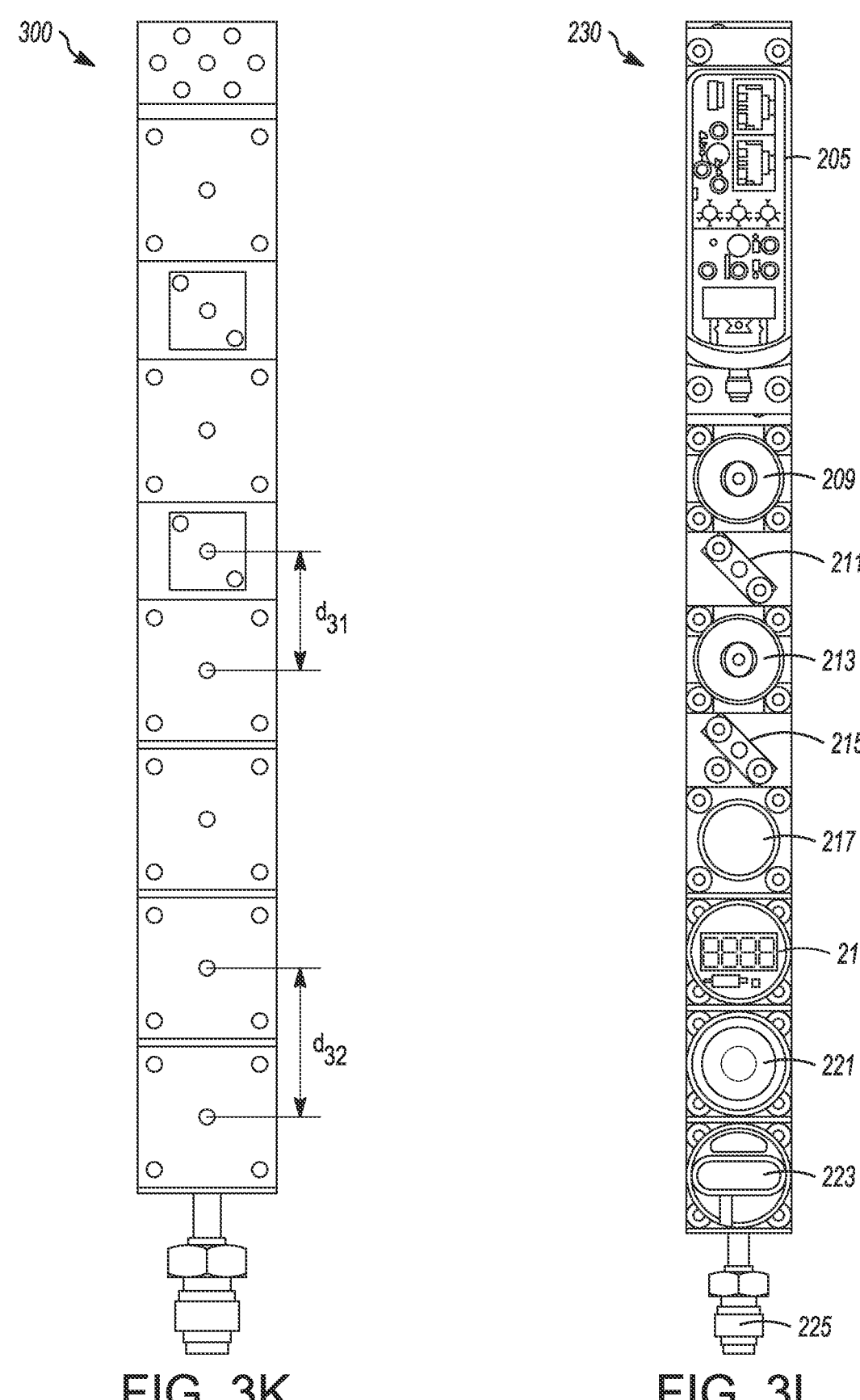
FIG. 3K shows an exemplary embodiment for a determination of a length of the primitive substrates of, for example, FIG. 3A.
FIG. 3L shows a plan view of an example of an exemplary arrangement of gas-delivery components mounted in series on a gas-component primitive substrate in accordance with various embodiments of the disclosed subject matter.

FIGS. 3H-A and 3H-B shows specific exemplary embodiments of various dimensions of the gas-component-configurable primitive substrates of FIGS. 3A through 3D and gas-component primitive substrates having integrated valves of FIGS. 3E through 3G. As noted in FIGS. 3H-A and 3H-B, these seven primitive substrates, the four gas-component-configurable primitive substrates 382, and the three gas-component primitive substrates 384, enable the build of all configurations of gas boxes. The various dimensions match, for example, the mounting patterns of the back-plane 101 (see FIG. 1) to which various ones of the primitive substrates of the disclosed subject matter can be affixed. Further, the dimensions, as described in more detail below with reference to FIGS. 3I through 3K, are selected to fit standard components, such as 2-port and 3-port valves, both along a length of various ones of the primitive substrate, as well as across primitive substrates. Each of these dimensions are provided merely to aid a person of ordinary skill in the art to have a better understanding of the disclosed subject matter. However, upon reading and understanding the disclosed subject matter, the person of ordinary skill in the art will recognize that dimensions other than those provided herein may be used in a given application.

For example, with continuing reference to FIG. 3H-A, in a specific exemplary embodiment, the facility-inlet primitive substrate 300 is a facility inlet that allows for, for example, a two-port LOTO valve, a regulator, a transducer, a filter, a two-port valve, a three-port valve, gas sharing, and purging.

An overall length, $d_1$, may be about 239.5 mm, a width, $d_2$, may be about 28.6 mm, a distance between ports, $d_3$, may be about 11.2 mm, and a distance, $d_4$, may be about 109.2 mm.

In another specific exemplary embodiment, the additional facility-inlet primitive substrate 320 is a facility inlet that allows for, for example, a two-port LOTO valve, a two-port valve, a three-port valve, gas sharing, and purging. An overall length, $d_5$, may be about 148.0 mm, a width, $d_6$, may be about 28.6 mm, a distance between ports, $d_7$, may be about 11.2 mm, and a distance, $d_8$, may be about 109.2 mm.

In another specific exemplary embodiment, the dual two-port-valve primitive substrate 340 is a two-port/two-port valve substrate that allows for, for example, two components to be mounted in series. An overall length, $d_9$, may be about 99.5 mm, a width, $d_{10}$, may be about 28.6 mm, a distance between ports, $d_{11}$, may be about 11.2 mm, and a distance, $d_{12}$, may be about 90.7 mm.

In another specific exemplary embodiment, the dual single-port primitive substrate 350 is a one-port/one-port substrate that allows for, for example, an MFC without an outlet valve to be mounted. components to be mounted in series. An overall length, $d_{13}$, may be about 44.5 mm, a width, $d_{14}$, may be about 28.6 mm, a distance between ports, $d_{15}$, may be about 11.2 mm, and a distance, die, may be about 35.7 mm.

In other examples, and now with continuing reference to FIG. 3H-B, in a specific exemplary embodiment, the dual-valve substrate 360 is a two-port/three-port valve that allows for, for example, a shutoff valve and purge valve. An overall length, $d_{17}$, may be about 118.0 mm, a width, $d_{18}$, may be about 28.6 mm, a distance, $d_{19}$, may be about 73.0 mm, and a distance, $d_{20}$, may be about 21.6 mm.

In another specific exemplary embodiment, the dual two-port-valve substrate 370 is a two-port/two-port valve that allows for, for example, two MFCs to be mounted in opposing directions (e.g., conjoined mass-flow controllers). An overall length, $d_{21}$, may be about 118.0 mm, a width, $d_{22}$, may be about 28.6 mm, a distance, $d_{23}$, may be about 73.0 mm, and a distance, $d_{24}$, may be about 21.6 mm.

In another specific exemplary embodiment, the single two-port-valve substrate 380 is a two-port valve that allows for, for example, a single shutoff valve. An overall length, $d_{25}$, may be about 118.0 mm, a width, $d_{26}$, may be about 28.6 mm, a distance, $d_{27}$, may be about 24.0 mm, and a distance, $d_{28}$, may be about 21.6 mm.

Figure 9:
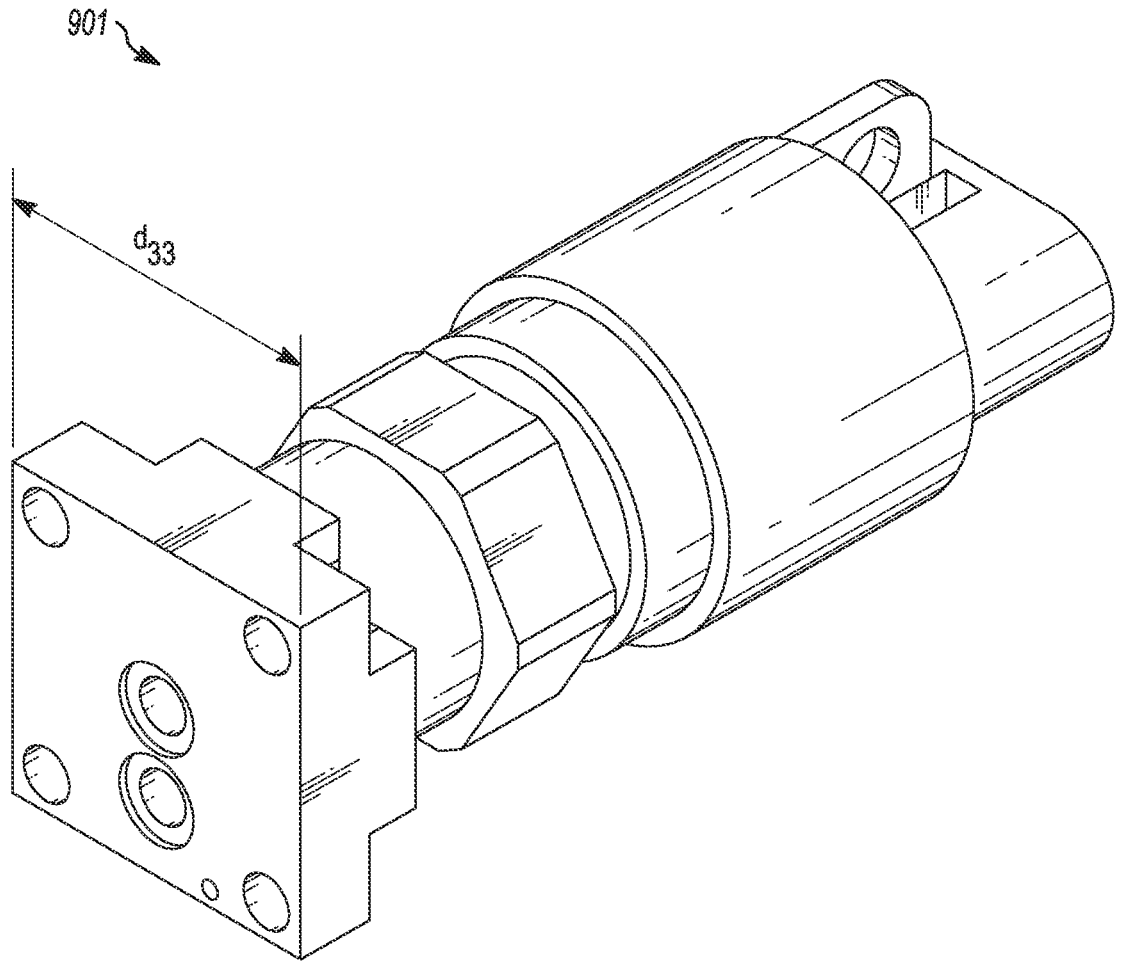
FIG. 9 shows an example of a typical two-port valve to illustrate how a determination is made of a width of various ones of the gas-component primitive substrates.

FIG. 3I shows an exemplary embodiment for a determination of a substrate-to-substrate distance (pitch distance) of the primitive substrates of, for example, FIG. 3A. FIG. 3I considers with spacing (pitch spacing) of primitive substrate. To minimize a stick-to-stick width spacing serves to increase or maximize the available space of a completed assembly. A minimum spacing that can be obtained is about 29 mm due to the size of a component's mounting flange plus tolerances (e.g., see a typical valve 901 as shown in FIG. 9, below). A pair of flame-impingement panels 386, used in many gas boxes, is installed between gas sticks (e.g., one of the pair is on either side of the gas stick). In various embodiments, a thickness of a flange comprising the FIP panels 386 is 0.8 mm. Consequently, due to the mounting flange width and the thickness of the FIP panels 386, a minimum spacing between adjacent gas sticks becomes about 29.8 mm. In various specific exemplary embodiments, about 0.7 mm is added for tolerance stack ups, leading to a pitch distance, $d_{29}$, of about 30.5 mm pitch as indicated in FIG. 3I. For comparison purposes, contemporaneous gas delivery substrates on the market allow only for a minimum spacing of 35.6 mm.

FIGS. 3J-A and 3J-B show exemplary embodiments for a determination of a height of the primitive substrates of, for example, FIG. 3A. In various embodiments, considerations of a height of a gas substrate seek to minimize a height of a substrate block to increase or maximize the available space of a completed assembly. In order to purge upstream of an MFC, and with reference to the facility-inlet primitive substrate 300 of FIGS. 3J-A and 3J-B, the three-port valve 315 location has at outlet location at the purge port 313, and may be implemented downstream of a two-port shutoff valve at the additional two-port valve 311 location with a connecting angled-bore 319. The connecting angled-bore 319 connects the two-port valve 311 location and the three-port location valve 315 location, thereby forming, between the two valves, a gas path between the outlet of the two-port valve and an inlet of the three-port valve. The connecting angled-bore 319 that connects the two ports dictates a minimum height of the blocks based on angle and bore diameter selections. In a specific exemplary embodiment, a distance, $d_{30}$, of the minimum height is 33.8 mm. The height determination of the primitive substrate is discussed in more detail with reference to FIGS. 10A and 10B, below.

FIG. 3K shows an exemplary embodiment for a determination of a length of the primitive substrates of, for example, FIG. 3A. The facility-inlet primitive substrate 300 of FIG. 3K serves to minimize a length of the substrate block to increase or maximize the available space of a completed assembly. In this example, due to a size of the approximately 30.5 mm mounting considerations as discussed above with reference to FIG. 3I, the 30.5 mm horizontal spacing (e.g., a distance $d_{32}$, of about 30.5 mm, which may be repeated three times) may be repeated in the vertical direction in various embodiments. For example, having the same distance in both horizontal and vertical directions can allow components bridging between component locations to be used either horizontally or vertically. Another distance $d_{33}$, of about 24.5 mm, may also be repeated three times as will be understandable to a person of ordinary skill in the art upon reading and understanding the disclosed subject matter.

FIG. 3L shows a plan view of an example of an exemplary arrangement of gas-delivery components mounted in series on a gas-component primitive substrate in accordance with various embodiments of the disclosed subject matter. The gas-component primitives, coupled in series, and populated with gas-delivery components in accordance with the disclosed subject matter, were also discussed with reference to FIGS. 2A and 2B, above.

In a specific exemplary embodiment, the LOTO valve 223 is the first component mounted and serves to guard personnel while servicing the gas-delivery box 100 (see FIG. 1). The regulator 221 is upstream of the transducer 219 so that the transducer 219 can indicate a setting of the regulator 221. The filter 217 is downstream of the regulator 219 to capture most or all particles generated by the regulator 221. The filter 217 is also upstream of the gas-splitting port 215 to that multiple gas sticks may be filtered when sharing gas. A two-port valve (e.g., the mass-flow controller inlet valve 213) is downstream of the gas-splitting port 215 so that other lines are not turned off when activating the two-port valve. A three-port valve (e.g., the purge valve 209) is downstream of the two-port valve to allow purging through the purge port 211 without having to manually turn off the LOTO valve 223. The three-port valve is also upstream of the MFC 205 to allow purging upstream of the MFC 205 due to an MFC failing (e.g., in a closed position).

Referring now to FIGS. 4A through 4C, additional details of the facility-inlet primitive substrate 300 in accordance with FIG. 3A used as, for example, a facility inlet to the gas-delivery box of FIG. 1 are shown. The facility-inlet primitive substrate 300 is shown to include the LOTO valve 223, the mass-flow controller inlet valve 213, and the purge valve 209, each already mounted. However, these valves are shown only to illustrate more fully to a person of ordinary skill in the art an overall concept of the additional details. Therefore, many other configurations of valves or other gas-delivery components are possible.

FIG. 4A is a three-dimensional view 400 of the facility-inlet primitive substrate 300 and is shown to include one of a plurality of substrate mounting-holes 401 and a number of gas-delivery-component mounting holes 403. The substrate mounting-holes 401 may be, for example, a through-hole allowing the facility-inlet primitive substrate 300 to be mounted physically to the gas-delivery box 100 of FIG. 1 by means of, for example, a machine screw or other fastening device known in the art. The gas-delivery-component mounting holes 403 may be, for example, tapped holes to allow various gas-delivery components to be mounted, along with the metal seals (e.g., C seals or W-seals, described above) or O-rings, also described above, to the facility-inlet primitive substrate 300 by machine screws or other fastening devices known in the art.

FIG. 4B shows an exemplary cross-sectional drawing 410 at section A-A of FIG. 4A. The cross-sectional drawing 410 shows a plurality of bore holes 405 that connect various ones of the port locations used for connecting the various gas-delivery components to gas flowing within the facility-inlet primitive substrate 300. For example, a bore hole 405 connects the location of the regulator 303 to the location of the LOTO valve 223. The bore holes 405 may be formed by a variety of machining, etching, and other methods known in the art such as, for example, machine drilling or laser drilling.

FIG. 4C shows an exemplary cross-sectional drawing 420 at section B-B of FIG. 4A. The cross-sectional drawing 420 shows additional bore holes that connect various ones of the port locations used for connecting the various gas-delivery components to gas flowing within the facility-inlet primitive substrate 300. Therefore, each of the bore holes of section A-A and section B-B may lay at least partially in separate cross-sectional planes within the body of the facility-inlet primitive substrate 300. A person of ordinary skill in the art will recognize that some or all of the gas-primitive substrates described herein may be similarly constructed to have bore holes in one or more cross-sectional planes within the respective bodies of the gas-primitive substrates described herein. In this exemplary embodiment of FIG. 4C, a horizontal section of the bore hole 407 may be drilled or otherwise machined or etched from one end of the facility-inlet primitive substrate 300. In this embodiment, the horizontal section of the bore hole 407 has a capping material 409 welded, formed, placed, or inserted after the bore hole 407 is formed. In a specific exemplary embodiment, the capping material 409 is welded in place after the interior passage is electropolished as described above. In another specific exemplary embodiment, the capping material 409 is a machine screw threaded into the open end of the facility-inlet primitive substrate 300. In this example, an O-ring material (e.g., depending on the type of gas transported, Kalrez® or other types of perfluorinated elastomer or fluoroelastomer materials, known in the art) may be used to prevent gas from leaking around the capping material 409.

Figure 5A:
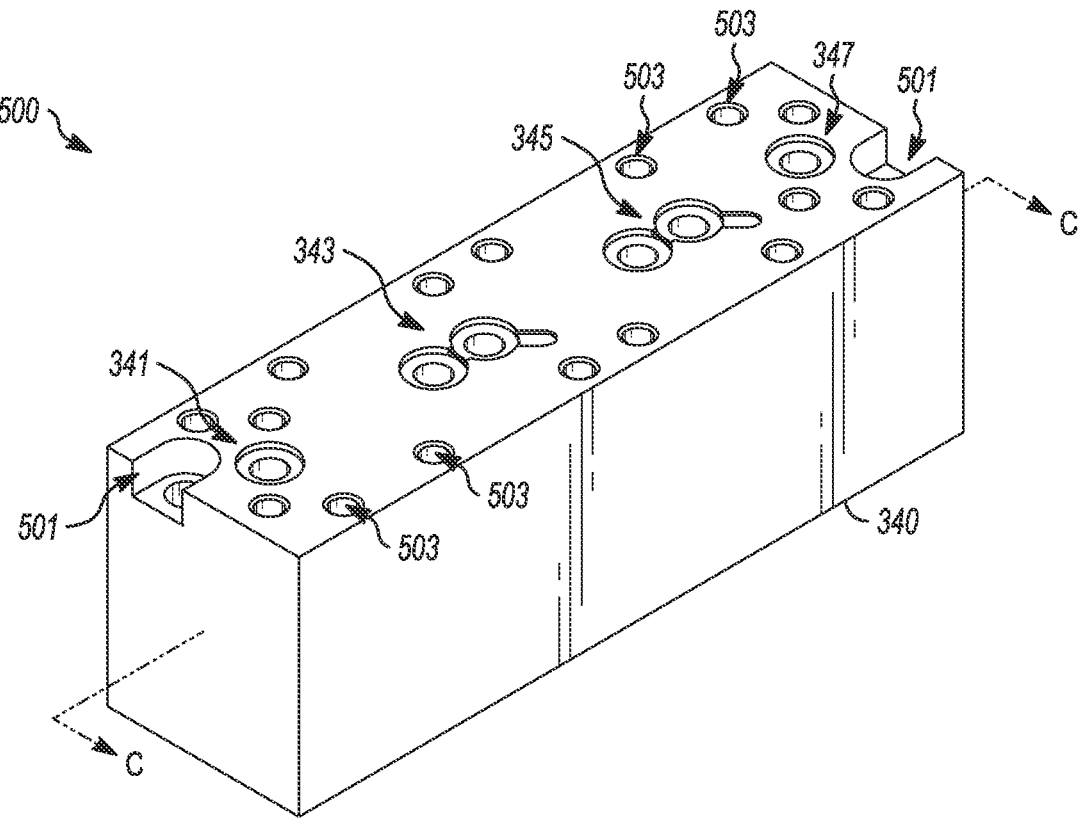
FIGS. 5A and 5B show additional details of the dual two-port-valve primitive substrate in accordance with FIG. 3C used to mount, for example, a purge-gas inlet-valve and a purge-gas transducer.
Figure 5B:
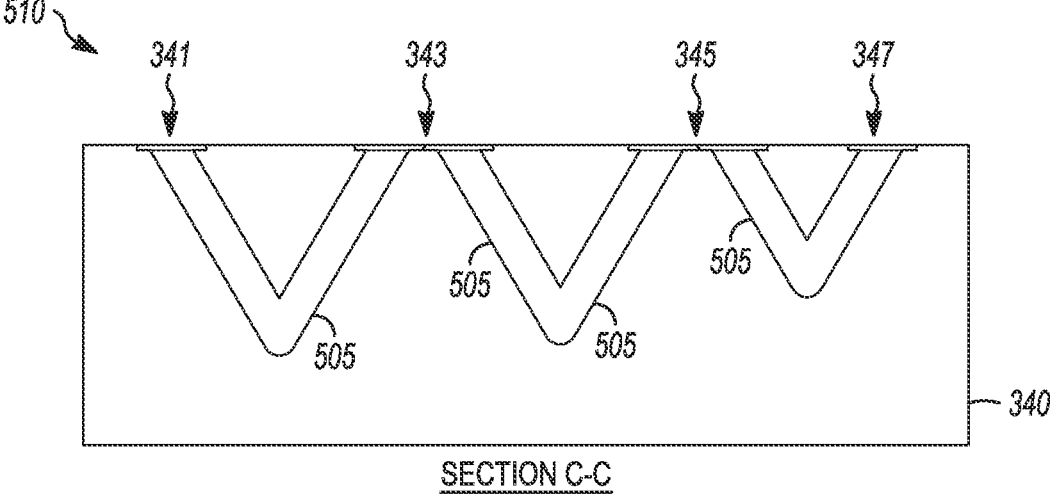

FIGS. 5A and 5B show additional details of the dual two-port-valve primitive substrate 340 in accordance with FIG. 3C used to mount, for example, a purge-gas inlet-valve and a purge-gas transducer. However, these valves are described only to illustrate more fully to a person of ordinary skill in the art an overall concept of the additional details. Therefore, many other configurations of valves or other gas-delivery components are possible.

FIG. 5A is a three-dimensional view 500 of the dual two-port-valve primitive substrate 340 and is shown to include one of a plurality of substrate mounting-holes 501 and a number of gas-delivery-component mounting holes 503. The substrate mounting-holes 501 may be, for example, a through-hole allowing the dual two-port-valve primitive substrate 340 to be mounted physically to the gas-delivery box 100 of FIG. 1 by means of, for example, a machine screw or other fastening device known in the art. The gas-delivery-component mounting holes 503 may be, for example, tapped holes to allow various gas-delivery components to be mounted to the dual two-port-valve primitive substrate 340 by machine screws or other fastening devices known in the art.

FIG. 5B shows an exemplary cross-sectional drawing 510 at section C-C of FIG. 5A. The cross-sectional drawing 510 shows a plurality of bore holes 505 that connect various ones of the port locations used for connecting the various gas-delivery components to gas flowing within the dual two-port-valve primitive substrate 340. For example, a bore hole 505 connects the inlet port 341 to the location of the first two-port valve 343. The location of the first two-port valve 343, in turn, is connected to the location of the second two-port valve 345, which is then connected to the outlet port 347. As with FIG. 4B, the bore holes 505 may be formed by a variety of machining, etching, and other methods known in the art such as, for example, machine drilling or laser drilling.

Figure 6A:
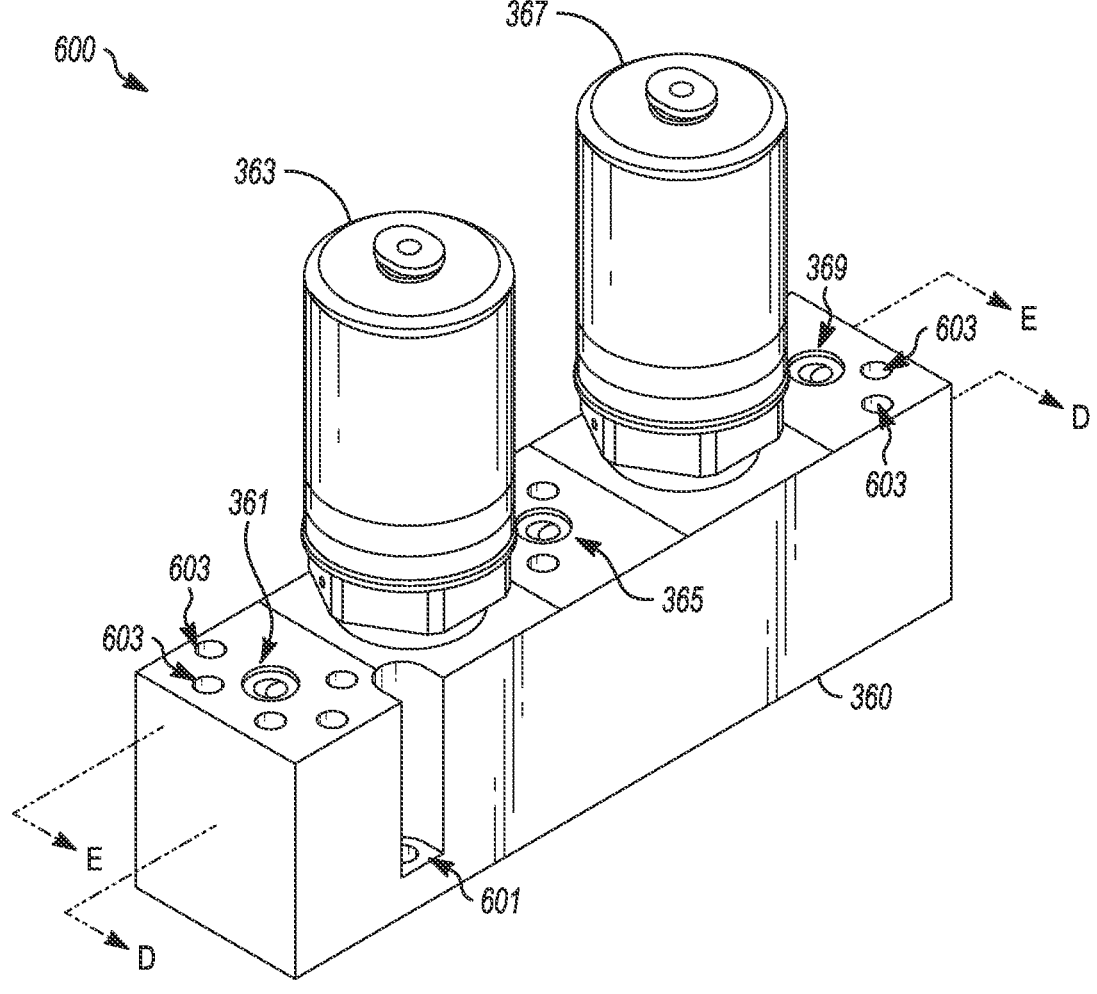
FIGS. 6A through 6C show additional details of the dual-valve substrate in accordance with FIG. 3E used with, for example, a combination of a shut-off valve and purge valve.
Figure 6B:
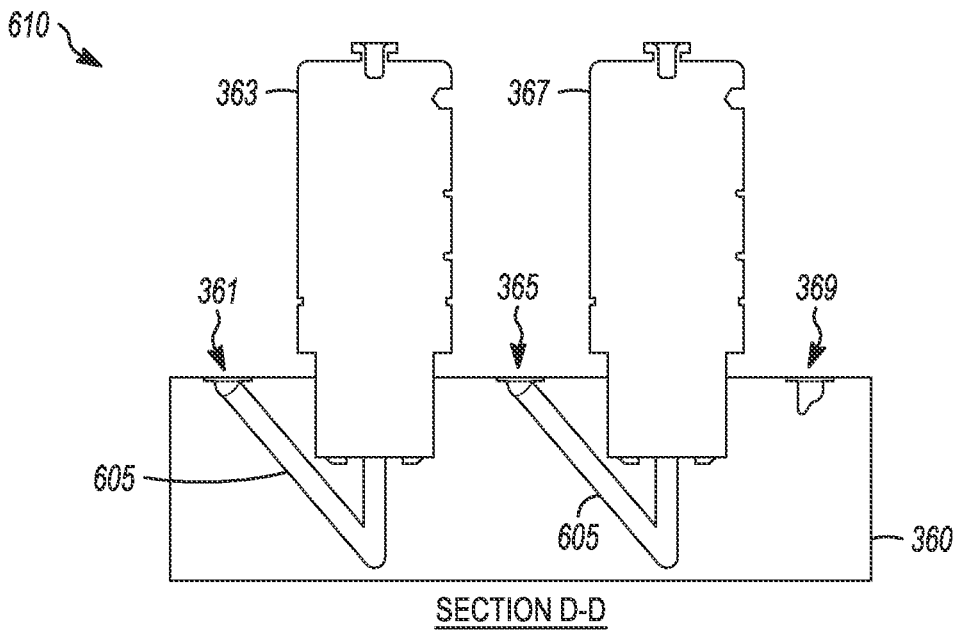
Figure 6C:
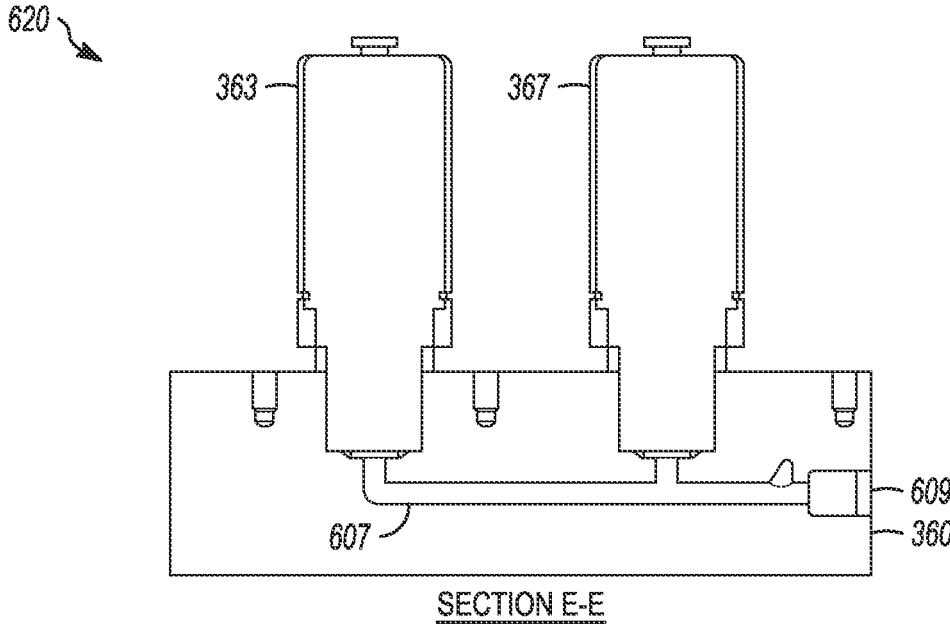

FIGS. 6A through 6C show additional details of the dual-valve substrate 360 in accordance with FIG. 3E used with, for example, a combination of a shut-off valve and purge valve. The dual-valve substrate 360 is shown to include the two-port valve 363 and the three-port valve 367, both of which are already mounted the dual-valve substrate 360. However, these valves are shown only to illustrate more fully to a person of ordinary skill in the art an overall concept of the additional details. Therefore, many other configurations of valves or other gas-delivery components are possible.

FIG. 6A is a three-dimensional view 600 of the dual-valve substrate 360 and is shown to include one of a plurality of substrate mounting-holes 601 and a number of gas-delivery-component mounting holes 603. As with the exemplary embodiments shown in FIGS. 4A through 5B, the substrate mounting-holes 601 may be, for example, a through-hole allowing the dual-valve substrate 360 to be mounted physically to the gas-delivery box 100 of FIG. 1 by means of, for example, a machine screw or other fastening device known in the art. The gas-delivery-component mounting holes 503 may be, for example, tapped holes to allow various gas-delivery components to be mounted to the dual-valve substrate 360 by machine screws or other fastening devices known in the art.

FIG. 6B shows an exemplary cross-sectional drawing 610 at section D-D of FIG. 6A. The cross-sectional drawing 610 shows a plurality of bore holes 605 that connect various ones of the inlet port 361 to the two-port valve 363, and the purge port 365 to the three-port valve 367, by bore holes 605. As noted above, the bore holes 605 may be formed by a variety of machining, etching, and other methods known in the art such as, for example, machine drilling or laser drilling.

FIG. 6C shows an exemplary cross-sectional drawing 620 at section E-E of FIG. 6A. The cross-sectional drawing 620 shows an additional bore hole 607 that connects, for example, the two-port valve 363 and the three-port valve 367 to each other and the outlet port 369 (not shown in FIG. 6C). In this exemplary embodiment, a horizontal section of the bore hole 607 may be drilled or otherwise machined or etched from one end of the dual-valve substrate 360. Also shown in this embodiment, the horizontal section of the bore hole 607 has a capping material 609 welded, formed, placed, or inserted after the bore hole 607 is formed. In a specific exemplary embodiment, the capping material 609 is welded in place after the interior passage is electropolished as described above. In another specific exemplary embodiment, the capping material 609 is a machine screw threaded into the open end of the dual-valve substrate 360. In this example, an O-ring material (e.g., depending on the type of gas transported, Kalrez® or other types of perfluorinated elastomer or fluoroelastomer materials, known in the art) may be used to prevent gas from leaking around the capping material 609.

Figure 7A:
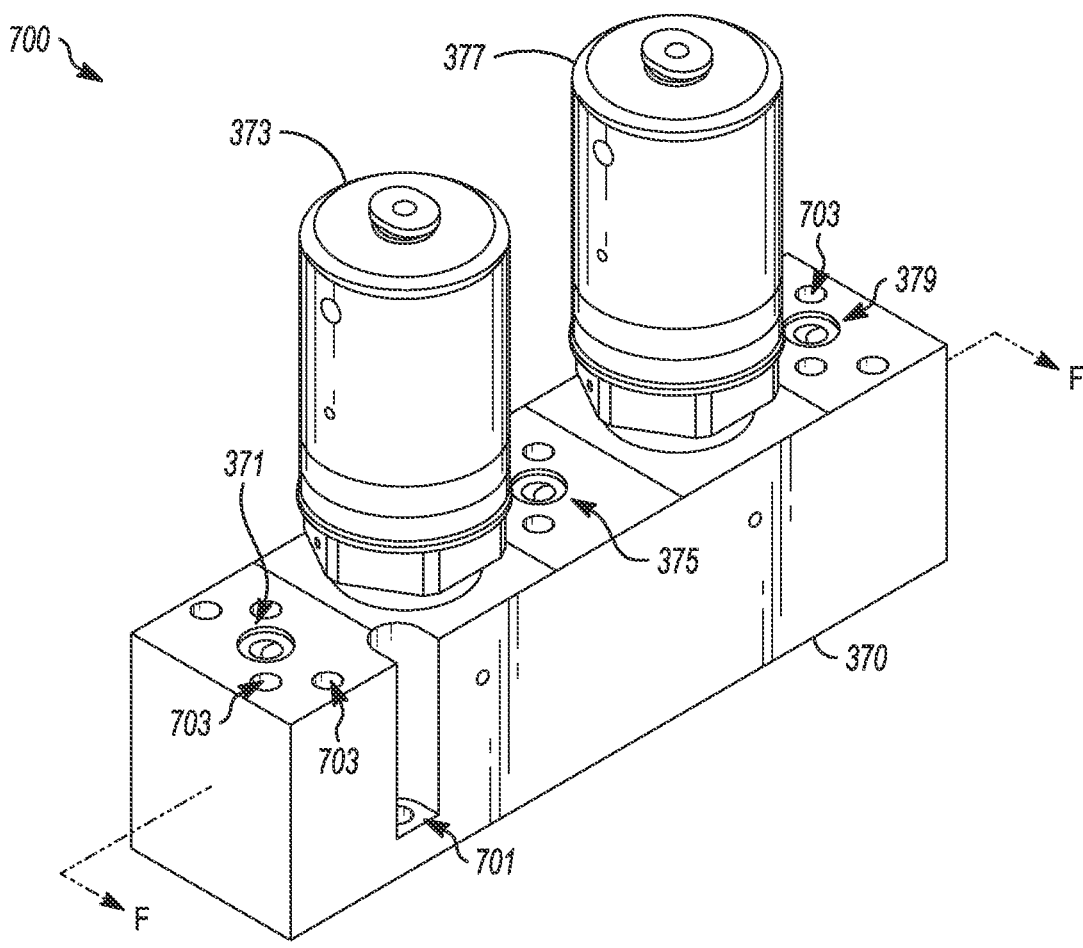
FIGS. 7A and 7B show additional details of the dual two-port-port valve substrate in accordance with FIG. 3F used to, for example, mount two mass-flow controllers.
Figure 7B:
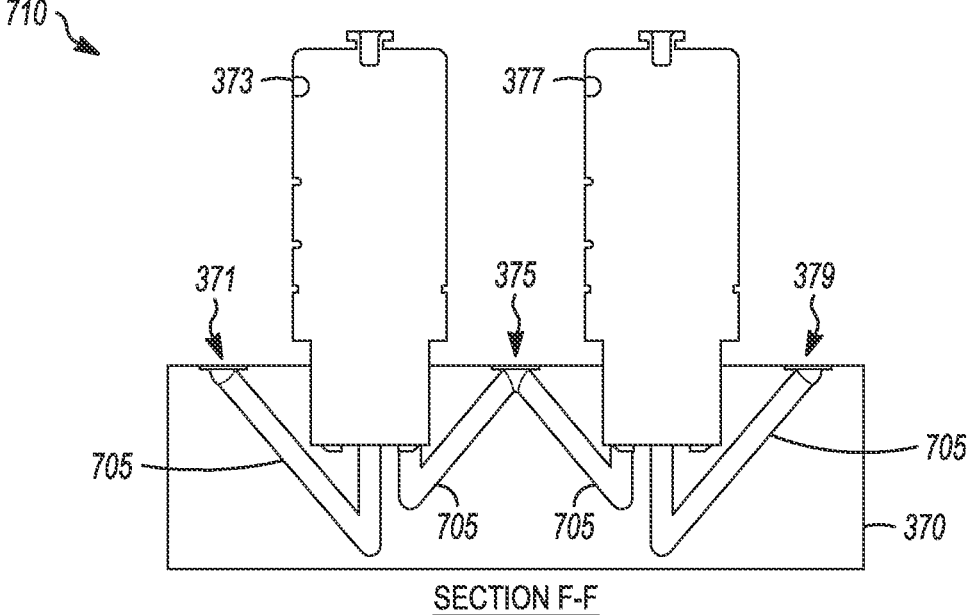

FIGS. 7A and 7B show additional details of the dual two-port-valve substrate 370 in accordance with FIG. 3F used to, for example, mount two mass-flow controllers. The dual two-port-valve substrate 370 is shown to include the first two-port valve 373 and the second two-port valve, both of which are already shown to be mounted. However, these valves are shown only to illustrate more fully to a person of ordinary skill in the art an overall concept of the additional details. Therefore, many other configurations of valves or other gas-delivery components are possible.

FIG. 7A is a three-dimensional view 700 of the dual two-port-valve substrate 370 and is shown to include one of a plurality of substrate mounting-holes 701 and a number of gas-delivery-component mounting holes 703. The substrate mounting-holes 701 may be, for example, through-holes allowing the dual two-port-valve substrate 370 to be mounted physically to the gas-delivery box 100 of FIG. 1 by means of, for example, machine screws or other fastening devices known in the art. The gas-delivery-component mounting holes 703 may be, for example, tapped holes to allow various gas-delivery components to be mounted to the dual two-port-valve substrate 370 by machine screws or other fastening devices known in the art.

FIG. 7B shows an exemplary cross-sectional drawing 710 at section F-F of FIG. 7A. The cross-sectional drawing 710 shows a plurality of bore holes 705 that connect various ones of the port locations used for connecting the various gas-delivery components to gas flowing within the dual two-port-valve substrate 370. For example, a first of the bore holes 705 connects the inlet port 371 to the first two-port valve 373, which in turn, connects the first two-port valve 373 to the additional gas port 375 through a second of the bore holes 705. The additional gas port 375 is also connected via the bore holes 705 to the second two-port valve 377, which in turn, is connected via the bore hole 705 to the outlet port 379. The bore holes 705 may be formed by a variety of machining, etching, and other methods known in the art such as, for example, machine drilling or laser drilling.

Figure 8A:
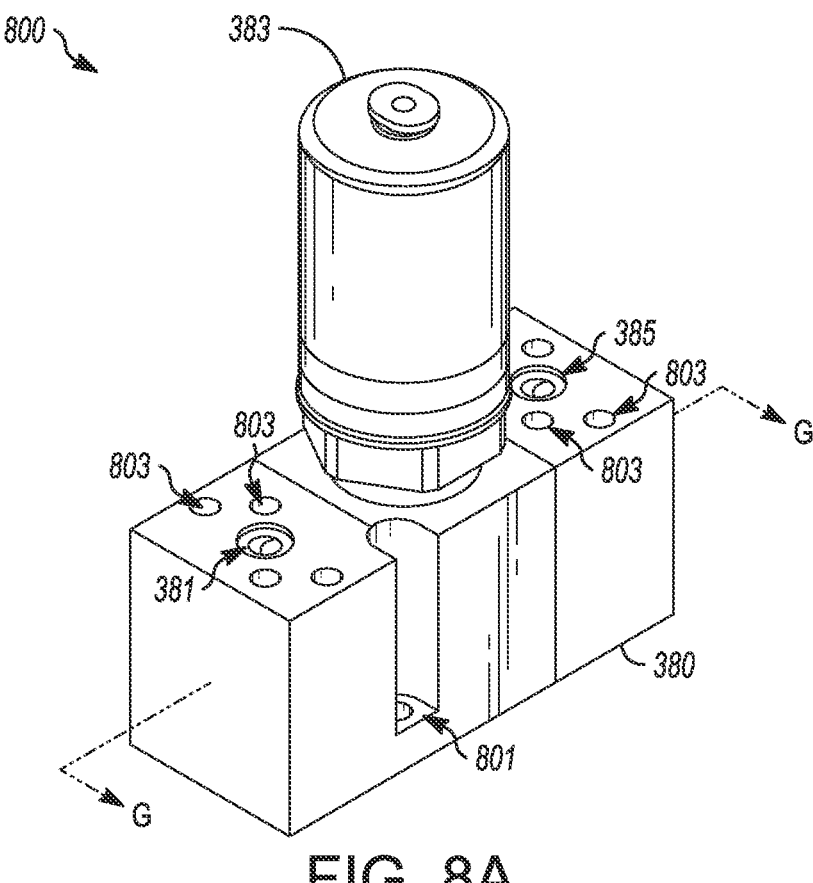
FIGS. 8A and 8B show additional details of the single two-port valve substrate in accordance with FIG. 3G used as, for example, a single shut-off valve.
Figure 8B:
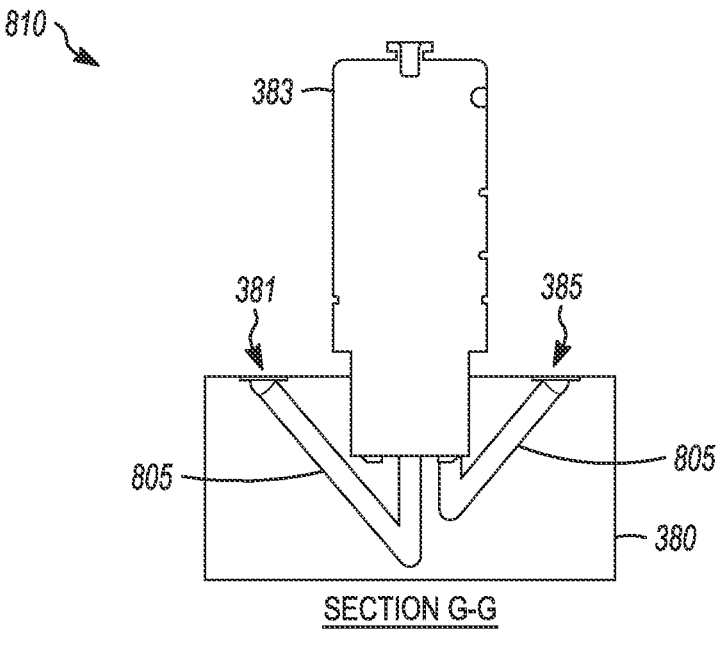

FIGS. 8A and 8B show additional details of the single two-port-valve substrate 380 in accordance with FIG. 3G used as, for example, a single shut-off valve. The single two-port-valve substrate 380 is shown to include the two-port valve 383. However, this valve is shown only to illustrate more fully to a person of ordinary skill in the art an overall concept of the additional details. Therefore, many other configurations of valves or other gas-delivery components are possible.

FIG. 8A is a three-dimensional view 800 of the single two-port-valve substrate 380 and is shown to include one of a plurality of substrate mounting-holes 801 and a number of gas-delivery-component mounting holes 803. The substrate mounting-holes 801 may be, for example, through-holes allowing the single two-port-valve substrate 380 to be mounted physically to the gas-delivery box 100 of FIG. 1 by means of, for example, machine screws or other fastening devices known in the art. The gas-delivery-component mounting holes 803 may be, for example, tapped holes to allow various gas-delivery components to be mounted to the single two-port-valve substrate 380 by machine screws or other fastening devices known in the art.

FIG. 8B shows an exemplary cross-sectional drawing 810 at section G-G of FIG. 8A. The cross-sectional drawing 810 shows a plurality of bore holes 805 that connect various ones of the port locations used for connecting the various gas-delivery components to gas flowing within the single two-port-valve substrate 380. For example, a first of the bore holes 805 connects the inlet port 381 to the two-port valve 383, which in turn, connects the two-port valve 383 to via a second of the bore holes 805 to the outlet port 385. As noted above, the bore holes 805 may be formed by a variety of machining, etching, and other methods known in the art such as, for example, machine drilling or laser drilling.

FIG. 9 shows an example of a typical valve 901 (or any other gas-delivery component) to illustrate how a determination is made of a width of various ones of the gas-component primitive substrates as shown in FIGS. 3A through 3G. The typical valve 901 may comprise, for example, the LOTO valve 223 or the two-port valve 203 (see FIG. 2A), or the three-port valve 315 (see FIG. 3A). A width, $d_{33}$, of the typical valve 901 determines, at least in part, a minimum width of various ones of the gas-component primitive substrates in order to maximize or increase available space of a completed gas stick assembly.

In a specific exemplary embodiment, the minimum spacing that can be obtained is about 29 mm due to the width, das, of the size of the mounting flange (about 28.6 mm in this example) of the typical valve 901 plus tolerances of the flange. In semiconductor fabrication facilities, some equipment manufacturers also use additional space for, for example, flame impingement panels (FIP) to be installed between adjacent gas sticks. In this specific exemplary embodiment, an approximately 0.8 mm FIP thickness was selected. Consequently, due to the width of the mounting flange and the FIP thickness, the minimum spacing between adjacent gas sticks is about 29.8 mm. An additional amount of about 0.7 mm is then added in this embodiment for a stack-up of tolerances, leading to a minimum width of about 30.5 mm. In contrast to the disclosed subject matter, contemporaneous gas-delivery sticks allow for only a minimum spacing of 35.6 mm. Therefore, in a gas deliver box with 24 gas-delivery substrates, over about 122 mm (approximately 4.8 inches) of total width is saved. Considered in another way, the greater than about 122 mm of width saved allows another four gas-delivery substrates, in accordance with embodiments of the disclosed subject matter, to be added to the gas-delivery box 100 of FIG. 1.

However, upon reading and understanding the disclosed subject matter, a person of ordinary skill in the art will recognize that this minimum width embodiment is provided merely to illustrate one example. The person of ordinary skill in the art will understand that a variety of other minimum widths may be found and utilized depending on at least some of the considerations presented in this specific exemplary embodiment.

Figure 10A:
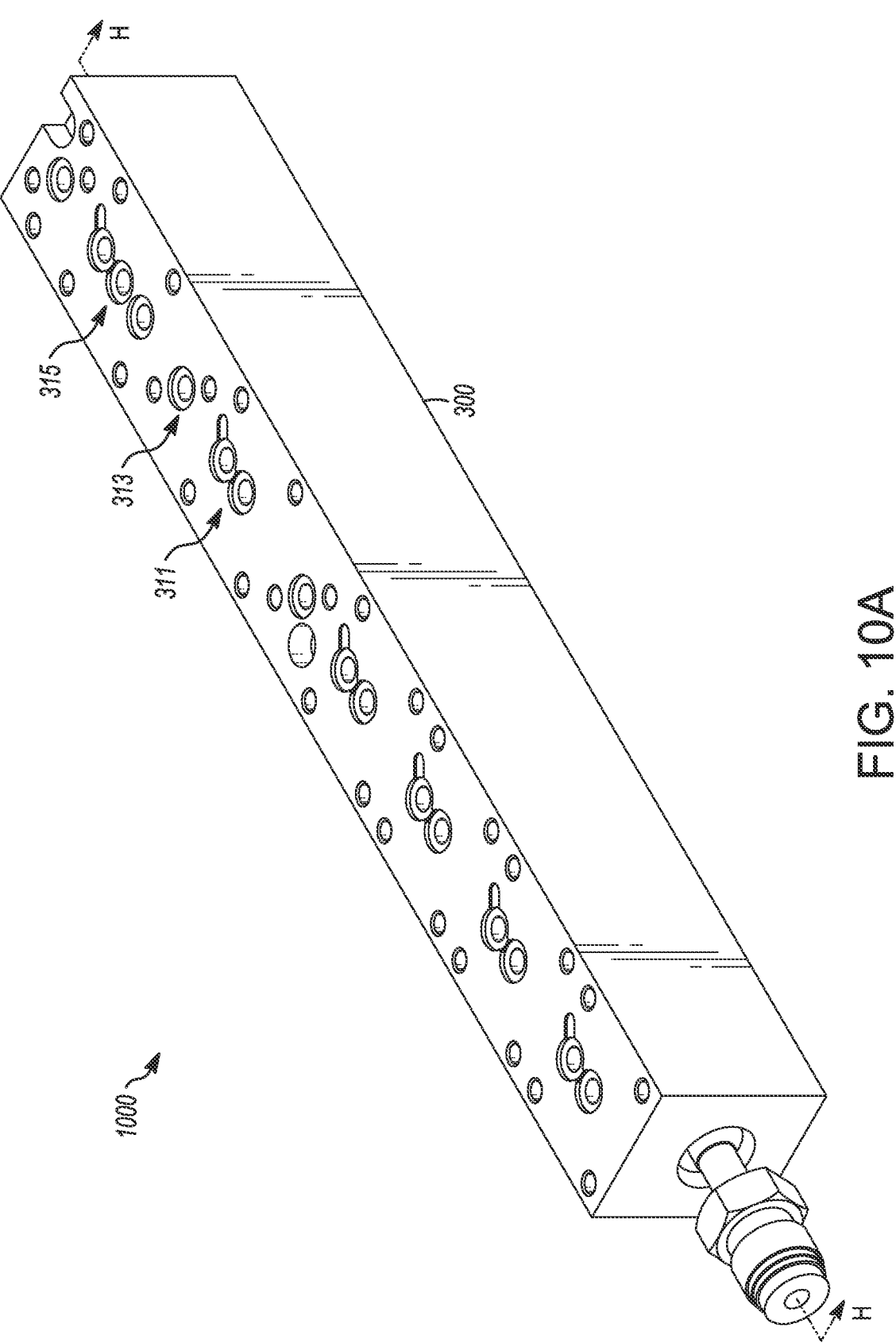
FIGS. 10A and 10B show examples to illustrate how a determination is made of a height of various ones of the gas-component primitive substrates.
Figure 10B:
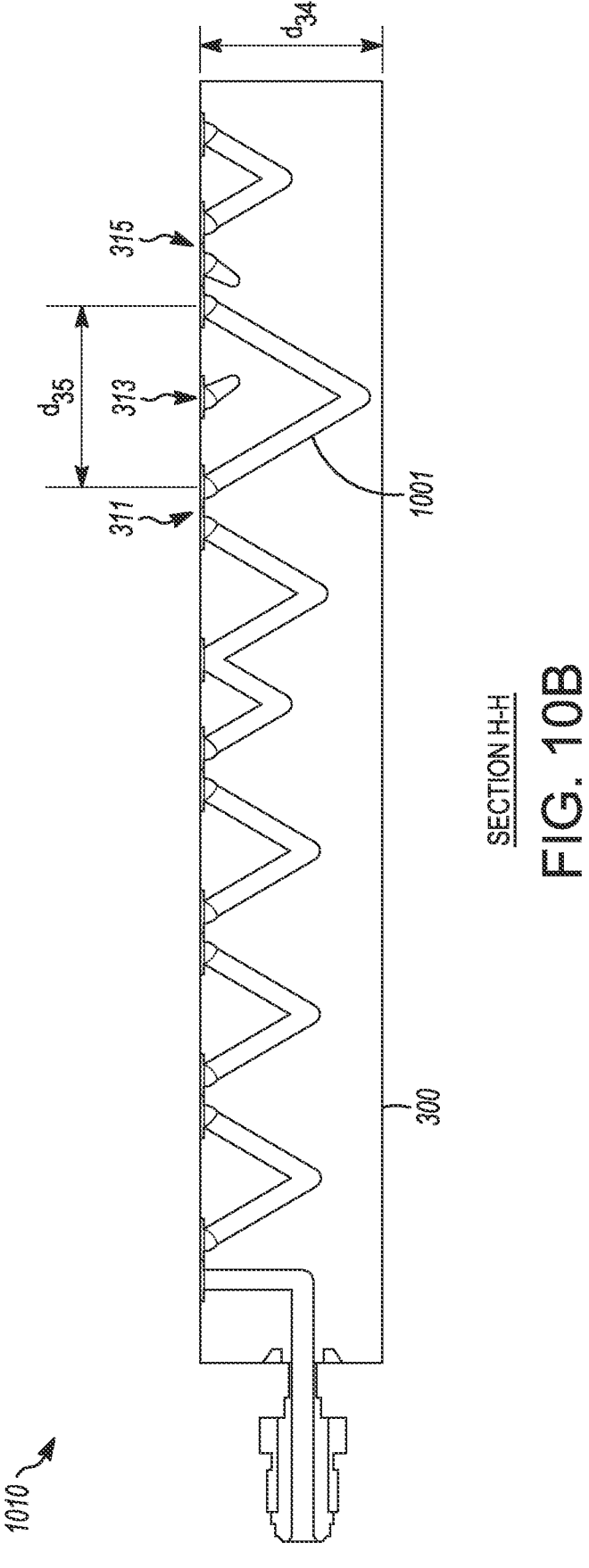

FIGS. 10A and 10B show examples to illustrate how a determination is made of a height of various ones of the gas-component primitive substrates. For example, in various embodiments, a height of the substrate may be reduced or minimized to increase or maximize available space of a completed substrate assembly.

FIG. 10A is a three-dimensional view 1000 of the facility-inlet primitive substrate 300 and highlights the locations of the two-port valve 311, the purge port 313, and the three-port valve 315, as described above with reference to FIGS. 3A and 4A through 4C. As is also noted above, in one embodiment, a mass-flow controller (not shown in FIG. 10A), may be purged using the three-port valve 315 that is upstream of the mass-flow controller, and the two-port valve 311, which is upstream of the three-port valve 315 with the purge port 313 being disposed between the two valves 311, 315. To connect a gas transport-path between an outlet of the two-port valve 311 and an inlet of the three-port valve 315, an angled bore hole is incorporated as described below with reference to FIG. 10B. The bore hole that connects the two ports indicates a minimum height of the substrate due to the angle of the bore hole (determined by a separation between the valves) and a diameter of the bore hole.

FIG. 10B shows an exemplary cross-sectional drawing 1010 at section H-H of FIG. 10A. The cross-sectional drawing 1010 shows a bore hole 1001 that connect the outlet of the two-port valve 311 location and the inlet of the three-port valve 315 location, within the facility-inlet primitive substrate 300. As a person of ordinary skill in the art will recognize, an angle of the bore hole 1001, combined with a diameter of the bore hole 1001, indicate an overall minimum height, $d_{34}$, of the facility-inlet primitive substrate 300. A "steepness" of the angle may be reduced, but then a distance, $d_{35}$, between the outlet of the two-port valve 311 and the inlet of the three-port valve 315 locations are increased. Therefore, based upon reading and understanding the disclosed subject matter, a person of ordinary skill in the art can decide whether the overall minimum height, $d_{34}$, or the distance, $d_{35}$, should be chosen to be minimized, or if a compromise between the two distances should be considered for a given application.

With reference now to FIG. 11, a bottom-outlet manifolding system 1100 of the prior art is shown. In the bottom-outlet manifolding system 1100, a gas-coupling point 1101 (e.g., a gas connection) is attached (connected) to a lower side of a gas-delivery component 1105 (e.g., a gas valve). The gas-coupling point 1101 then allows transport of gases to or from the gas-delivery component 1105 through tubing 1103. As will be recognizable to a skilled artisan, there can be considerable difficulty in accessing the gas-coupling point 1101 and the tubing 1103. All connections, or disconnections, are made from underneath the gas-delivery component 1105, which may require a substantial portion of the components in a gas box to be removed in order to access even a single connection.

Figure 12:
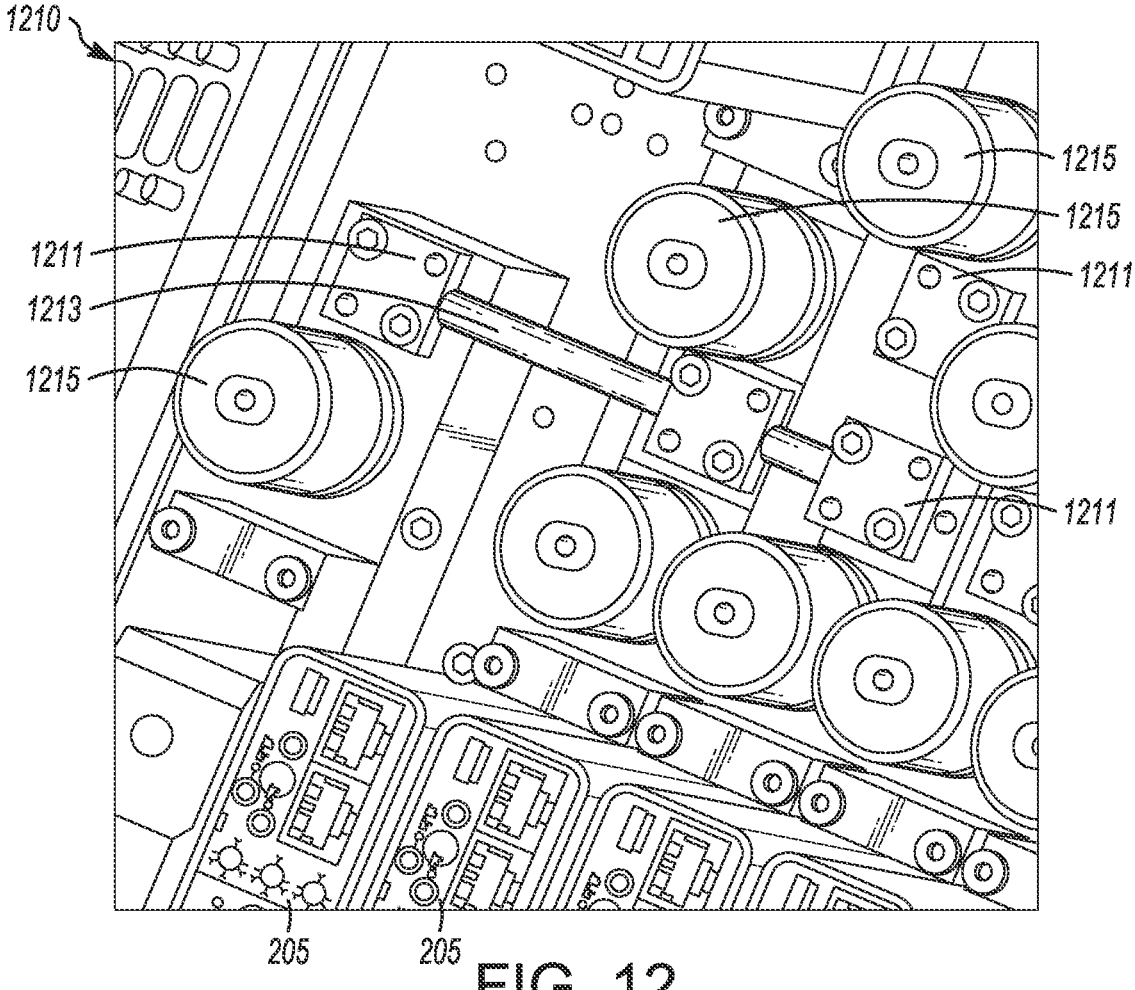
FIG. 12 shows an example of a top-manifolding system in accordance with various embodiments of the disclosed subject matter.

FIG. 12 shows an example of a top-manifolding system 1210 in accordance with various embodiments of the disclosed subject matter. In the top-manifolding system 1210, various connections are made to or from gas-delivery components 1215 (e.g., gas valves) through gas-coupling points 1211. The gas-coupling points 1211 made be attached using, for example, various types of C-seals, W-seals, O-rings, or other techniques and components described above. The gas-coupling points 1211 allow transport of gases to or from the interconnected ones of the gas-delivery components 1215 through tubing 1213. The tubing 1213 may be connected to the gas-coupling points 1211 by various techniques known in the art (e.g., welding). In various embodiments, the gas-coupling points 1211 and the tubing 1213 may be formed from various materials and prepared (e.g., electropolished) in accordance with the SEMI Standards described above. In other embodiments, other materials described above may be used to form the gas-coupling points 1211 and the tubing 1213.

As will be readily recognizable to a skilled artisan, the top-manifolding system 1210 allows all connections (e.g., of the gas-coupling points 1211 to the substrates) to be made from an uppermost side of various ones of the gas-component primitive substrates described above. Therefore, the top-manifolding system 1210 allows considerable ease and accessibility to the substrates and associated gas-delivery components.

Further, the top-manifolding system 1210 allows for much faster assembly, or reassembly, than the bottom-outlet manifolding system 1100 of FIG. 11. With the top-manifolding system 1210, all substrates can be mounted onto the back-plane 101 of the gas-delivery box 100 (see FIG. 1). The gas-coupling points 1211 and the tubing 1213 are then mounted from the top of the substrates, thereby allowing fast configurability of all components in a gas-delivery system. Moreover, changing various aspects of the gas-delivery system using the top-manifolding system 1210 does not require the whole gas system to be disassembled to pull out the manifolds, as is required under the prior art system as shown in FIG. 11.

Overall, the disclosed subject matter contained herein describes or relates generally to gas-component primitive substrates that can be configured to quickly assemble gas-delivery boxes used with operations of tools in a semiconductor fabrication environment (fab). Such tools can include various types of deposition (including plasma-based tools such as atomic-layer deposition (ALD), chemical vapor deposition (CVD), plasma-enhanced CVD (PECVD), etc.) and etching tools (e.g., reactive-ion etching (RIE) tools), as well as various types of thermal furnaces (e.g., such as rapid thermal annealing and oxidation), ion implantation, and a variety of other process and metrology tools found in various fabs and known to a person of ordinary skill in the art. However, the disclosed subject matter is not limited to semiconductor environments and can be used in a number of machine-tool environments such as gas-control operations in robotic assembly, manufacturing, and machining environments (e.g., including those operations using physical vapor deposition (PVD tools)), as well as a variety of other environments. Upon reading and understanding the disclosure provided herein, a person of ordinary skill in the art will recognize that various embodiments of the disclosed subject matter may be used with other types of process tools as well as a wide variety of other tools, equipment, and components.

As used herein, the term "or" may be construed in an inclusive or exclusive sense. Further, other embodiments will be understood by a person of ordinary skill in the art upon reading and understanding the disclosure provided. Further, upon reading and understanding the disclosure provided herein, the person of ordinary skill in the art will readily understand that various combinations of the techniques and examples provided herein may all be applied in various configurations.

Although various embodiments are discussed separately, these separate embodiments are not intended to be considered as independent techniques or designs. As indicated above, each of the various portions may be inter-related and each may be used separately or in combination with other embodiments discussed herein. For example, although various embodiments of methods, operations, and processes have been described, these methods, operations, and processes may be used either separately or in various combinations.

Consequently, many modifications and variations can be made, as will be apparent to a person of ordinary skill in the art upon reading and understanding the disclosure provided herein. Further, functionally equivalent methods and devices within the scope of the disclosure, in addition to those enumerated herein, will be apparent to the skilled artisan from the foregoing descriptions. Portions and features of some embodiments, materials, and construction techniques may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

What is claimed is:

1. A gas-primitive substrate, comprising:
at least one location on which a gas-delivery component is to be mounted on the gas-primitive substrate, the at least one location comprising at least a gas-delivery component inlet port and a gas-delivery component outlet port formed within a body of the gas-primitive substrate, the gas-primitive substrate having a gas-splitting port, a purge port, and an outlet port, each of the gas-splitting port, the purge port, and the outlet port being configured to be coupled to other locations by a top-manifolding interconnection scheme; and
at least one first pair of bore holes comprising a gas-flow path formed on an upstream side and a downstream side, respectively, of the location of the gas-delivery component.

2. The gas-primitive substrate of claim 1, wherein:
the gas-primitive substrate inlet port is configured to couple the gas-primitive substrate to a gas-supply line; and
the outlet port is configured to couple the gas-primitive substrate to at least one subsequent component selected from components, including an equipment gas-inlet supply line and a subsequent gas-primitive substrate.

3. The gas-primitive substrate of claim 1, wherein each of the at least one first pair of bore holes is formed at an angle and within the gas-primitive substrate.

4. The gas-primitive substrate of claim 1, wherein multiple ones of the gas-primitive substrate are configured to be at least partially coupled in series with one another within a gas-delivery box.

5. The gas-primitive substrate of claim 1, wherein the at least one first pair of bore holes lies at least partially in a separate cross-sectional plane from a cross-sectional plane of other bore holes, both cross-sectional planes laying within the body of the gas-primitive substrate.

6. The gas-primitive substrate of claim 1, wherein the gas-primitive substrate comprises a total of seven gas-primitive substrates from which a gas-delivery box can be assembled.

7. The gas-primitive substrate of claim 6, wherein at least some of the seven gas-primitive substrates include a gas-primitive substrate having integrated valves.

8. The gas-primitive substrate of claim 1, wherein a plurality of the gas-primitive substrate is configured to assemble gas-delivery boxes used with operations of tools in a semiconductor-fabrication environment.

9. The gas-primitive substrate of claim 1, wherein the gas-primitive substrate is configured such that the gas-delivery component is to be mounted from only an uppermost surface of the gas-primitive substrate.

10. The gas-primitive substrate of claim 1, wherein the gas-delivery components include at least one component selected from components including two-port gas valves, three-port gas valves, mass-flow controllers, mass-flow meters, regulators, transducers, and filters.

11. The gas-primitive substrate of claim 1, wherein at least some of the ports are coupled to at least one of a remaining port and one or more of the gas-delivery components through at least one second pair of bore holes comprising a gas-flow path formed on an upstream side and a downstream side, respectively, of the location of the port.

12. A gas-primitive substrate, comprising:
at least one location on which a gas-delivery component is to be mounted on the gas-primitive substrate, the at least one location including at least a gas-delivery component inlet port and a gas-delivery component outlet port formed within a body of the gas-primitive substrate, the gas-primitive substrate configured such that the gas-delivery component is to be mounted from only an uppermost surface of the gas-primitive substrate;
at least one first pair of bore holes comprising a gas-flow path formed on an upstream side and a downstream side, respectively, of the location of the gas-delivery component, the at least one pair of bore holes laying at least partially in a separate cross-sectional plane from a cross-sectional plane of other bore holes in the gas-primitive substrate, both cross-sectional planes laying within the body of the gas-primitive substrate; and
at least one port selected from ports including a purge port and a gas-splitting port in the gas-primitive substrate.

13. The gas-primitive substrate of claim 12, wherein each of the at least one ports is coupled to at least one of a remaining port and one or more of the gas-delivery components through at least one second pair of bore holes comprising a gas-flow path formed on an upstream side and a downstream side, respectively, of the location of the at least one port.

14. The gas-primitive substrate of claim 12, wherein each of the at least one ports is a gas-coupling point that comprises a portion of a top-manifolding system, whereby connections are configured to be made to or from other gas-delivery components, including other gas-primitive substrates, only from an uppermost portion of the gas-primitive substrate on which the at least one port is located.

15. The gas-primitive substrate of claim 12, wherein:
the gas-primitive substrate inlet port is configured to couple the gas-primitive substrate to a gas-supply line; and
the outlet port is configured to couple the gas-primitive substrate to at least one subsequent component selected from components, including an equipment gas-inlet supply line and a subsequent gas-primitive substrate.

16. The gas-primitive substrate of claim 12, wherein each of the at least one first pair of bore holes is formed at an angle and within the gas-primitive substrate.

17. A gas-primitive substrate, comprising:
a facility inlet having a gas-fitting component, the gas-primitive substrate being configured to accept gas-delivery components including a two-port lockout/tagout (LOTO) valve, a regulator, a transducer, a filter, an additional two-port valve, and a three-port valve;
the gas-primitive substrate further having at least one first pair of bore holes comprising a gas-flow path formed on an upstream side and a downstream side, respectively, of a location of each of the gas-delivery components, the at least one pair of bore holes laying at least partially in a separate cross-sectional plane from a cross-sectional plane of other bore holes in the gas-primitive substrate, both cross-sectional planes laying within the body of the gas-primitive substrate.

18. The gas-primitive substrate of claim 17, wherein the gas-primitive substrate includes a gas-splitting port, a purge port, and an outlet port, each of the gas-splitting port, the purge port, and the outlet port being configured to be coupled to other locations by a top-manifolding interconnection scheme.

19. The gas-primitive substrate of claim 18, wherein:
the facility inlet is configured to couple the gas-primitive substrate to a gas-supply line; and
the outlet port is configured to couple the gas-primitive substrate to at least one subsequent component selected from components, including an equipment gas-inlet supply line and a subsequent gas-primitive substrate.

20. The gas-primitive substrate of claim 17, wherein each of the at least one first pair of bore holes is formed at an angle and within the gas-primitive substrate.

\* \* \* \* \*